United States Patent [19]
Konishi

[11] Patent Number: 4,533,841
[45] Date of Patent: Aug. 6, 1985

[54] MOS LOGIC CIRCUIT RESPONSIVE TO AN IRREVERSIBLE CONTROL VOLTAGE FOR PERMANENTLY VARYING ITS SIGNAL TRANSFER CHARACTERISTIC

[75] Inventor: Satoshi Konishi, Tokyo, Japan
[73] Assignee: Tokyo Shibaura Denki Kabushiki Kaisha, Japan
[21] Appl. No.: 414,832
[22] Filed: Sep. 3, 1982

[30] Foreign Application Priority Data

Sep. 3, 1981 [JP] Japan .............................. 56-138835
Sep. 16, 1981 [JP] Japan .............................. 56-145810

[51] Int. Cl.³ ................ H03K 19/094; H03K 19/173; H03K 19/20
[52] U.S. Cl. .................................. 307/468; 307/469; 307/471; 307/451; 364/716
[58] Field of Search ............... 307/448, 451, 468, 469, 307/471, 472; 340/825.83, 825.84, 825.87; 364/716; 365/96

[56] References Cited

U.S. PATENT DOCUMENTS

| | | |
|---|---|---|
| 3,101,574 | 8/1965 | Szekely . |
| 3,691,401 | 9/1972 | Forlani et al. ...................... 307/215 |
| 3,742,254 | 6/1973 | Henrion et al. ..................... 307/251 |
| 4,399,372 | 8/1983 | Tanimoto et al. ................ 365/96 X |
| 4,424,456 | 1/1984 | Shiraki et al. .................... 307/451 X |
| 4,446,534 | 5/1984 | Smith .................................... 365/96 |
| 4,476,546 | 10/1984 | Varshney .......................... 365/96 X |

OTHER PUBLICATIONS

Session VIII: "Memories and Redundancy Techniques", Feb. 18, 1981, IEEE International Solid-State Circuits Conference, Kokkonen et al.
IBM Technical Disclosure Bulletin, "Programmable Arithmetic/Logic Circuit", vol. 23, No. 11, Apr. 1981.

Primary Examiner—Larry N. Anagnos
Attorney, Agent, or Firm—Finnegan, Henderson, Farabow, Garrett & Dunner

[57] ABSTRACT

A MOS logic circuit including a known MOS logic circuit arrangement having a particular input/output signal transfer characteristic and a control gating circuit including an FET connected to the known MOS logic circuit arrangement, the gate of which gating circuit receives a control voltage derived from an irreversible control voltage generator utilizing a fuse. Under the control of the irreversible control voltage, the MOS logic circuit can permanently change the known logic circuit arrangement's signal transfer characteristic without varying its logic function.

19 Claims, 77 Drawing Figures

F I G. 10
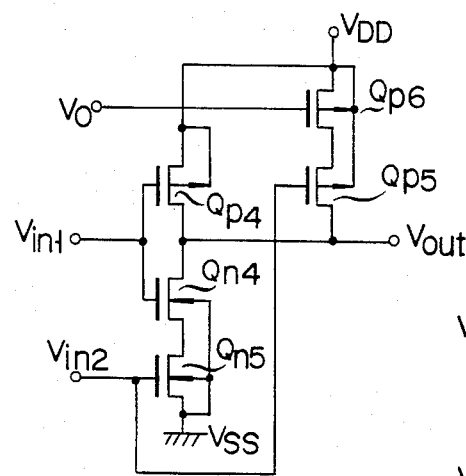
F I G. 11
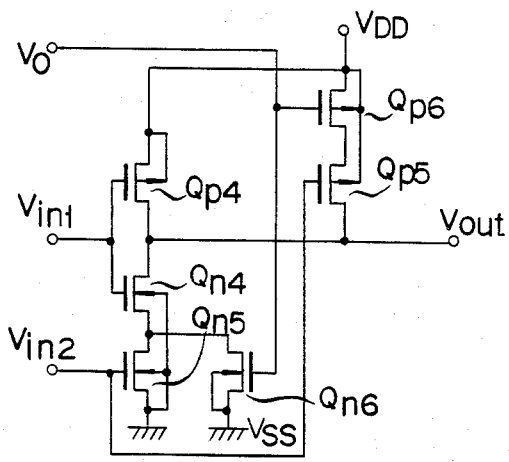
F I G. 12
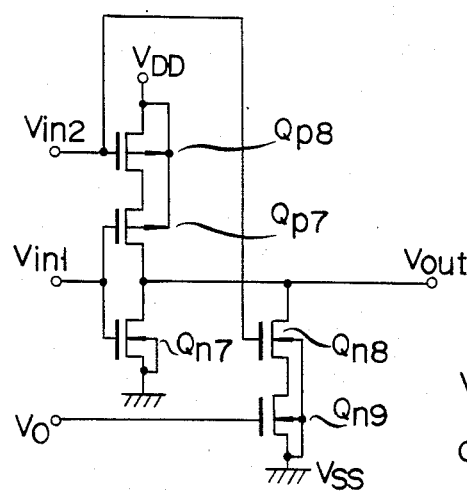
F I G. 13
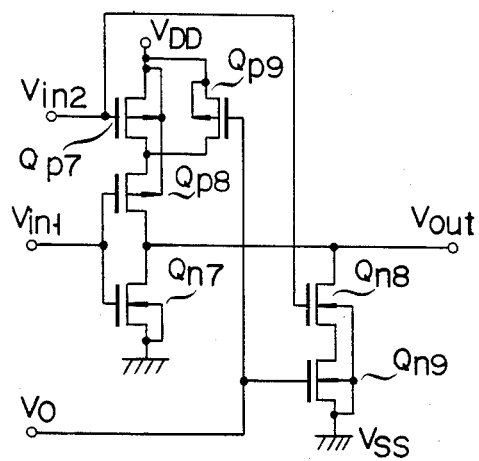

F I G. 17
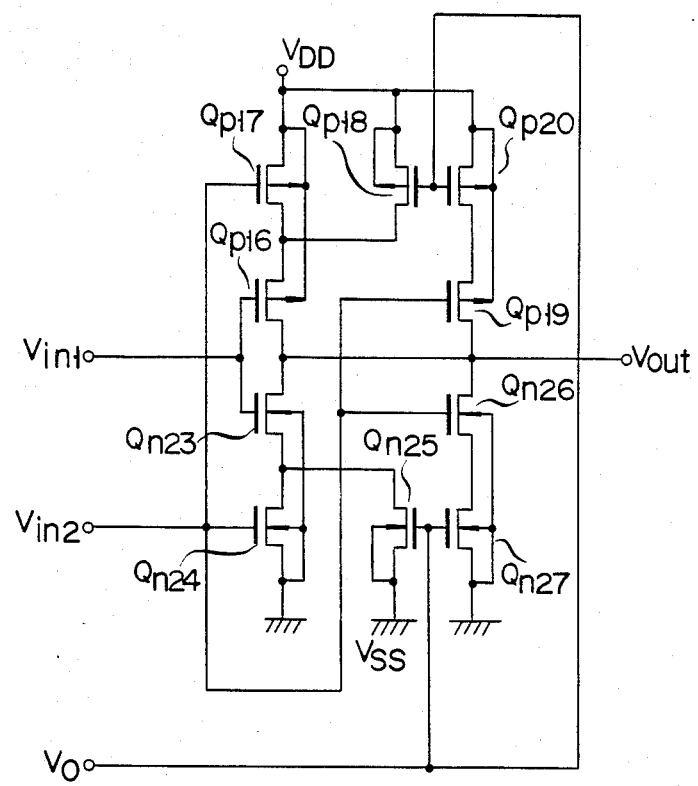
F I G. 18
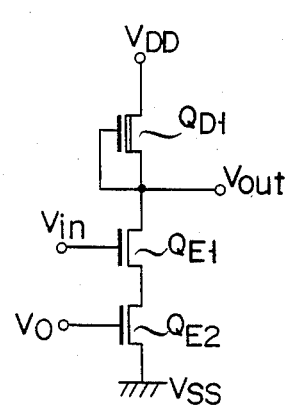
F I G. 19
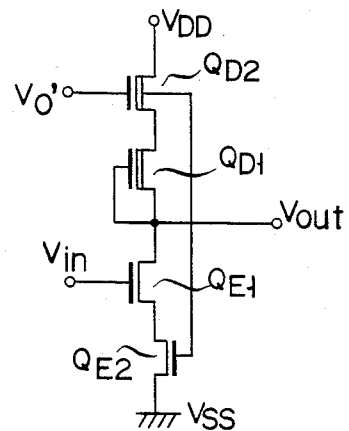

F I G. 20
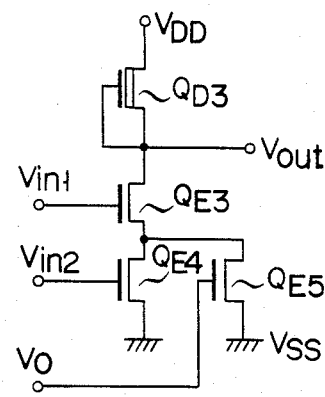
F I G. 21
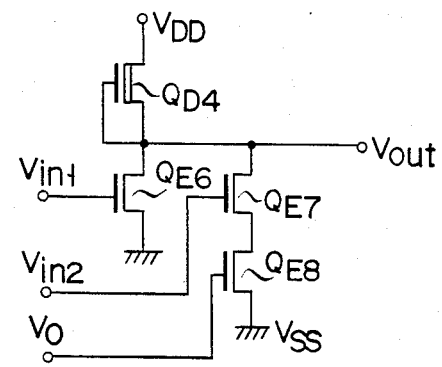
F I G. 22
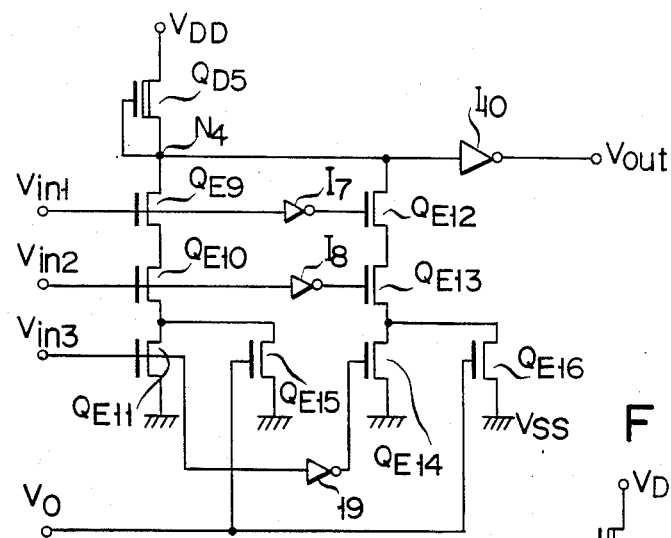
F I G. 23
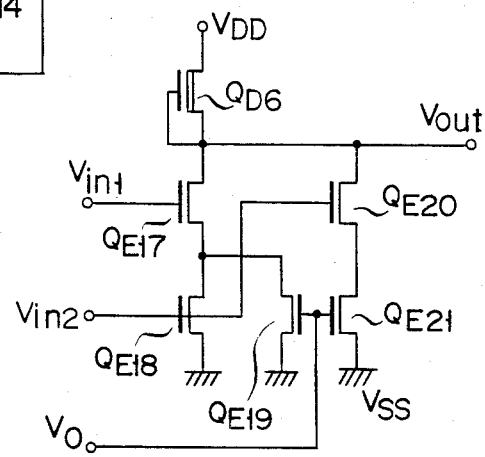

F I G. 24A 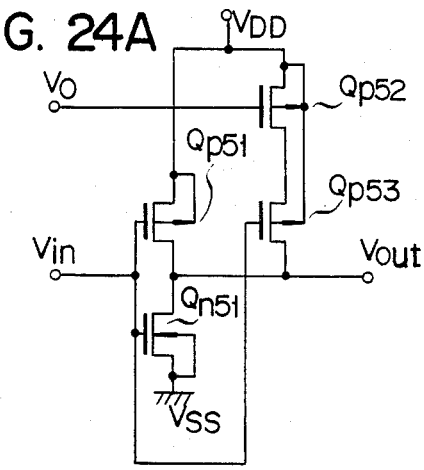
F I G. 24B 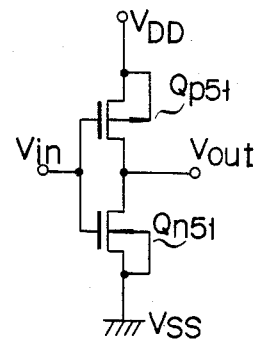
F I G. 24C 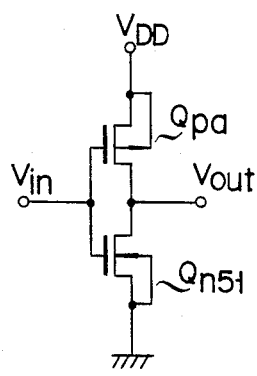
F I G. 24D 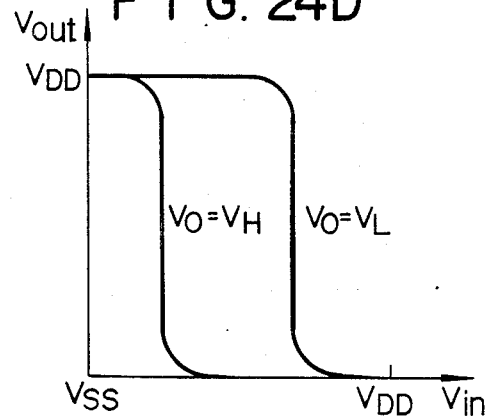
F I G. 25A 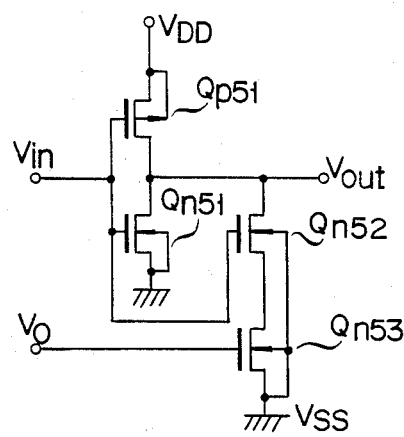
F I G. 25B 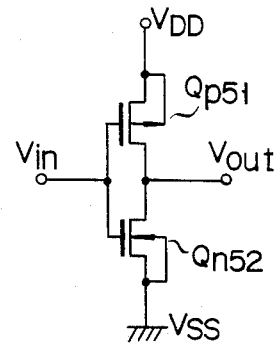

F I G. 27A
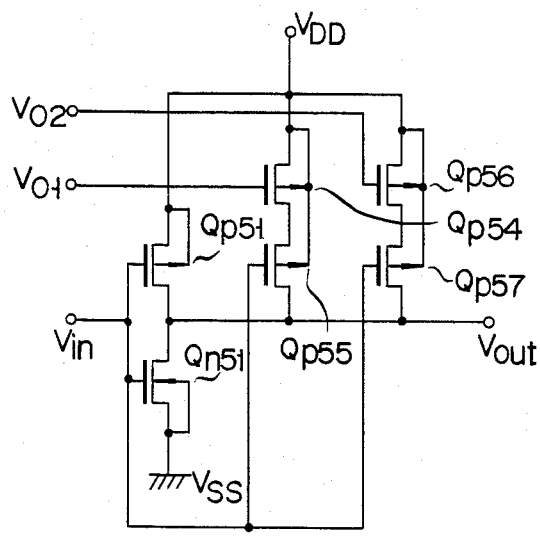
F I G. 27B
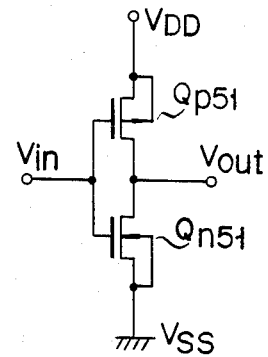
F I G. 27C
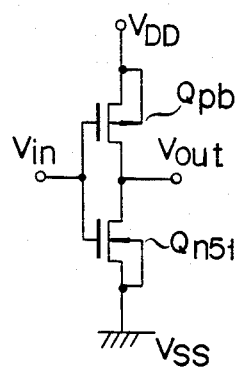
F I G. 27D
F I G. 27E
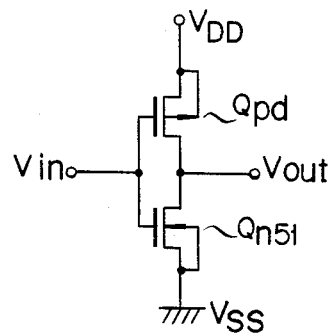

F I G. 28A
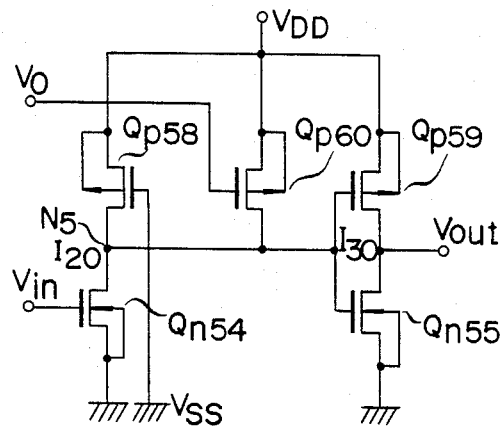
F I G. 28B
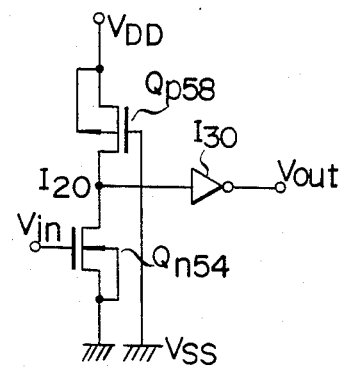
F I G. 28C
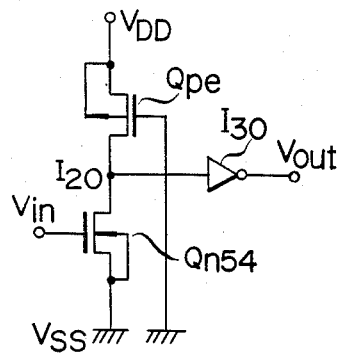
F I G. 29A
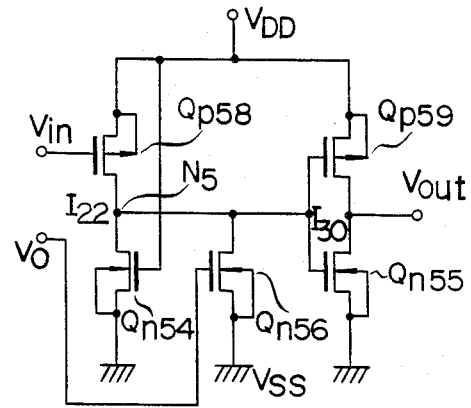
F I G. 29B
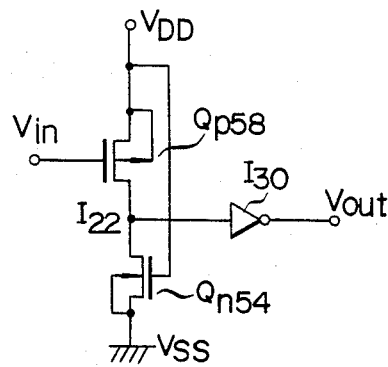
F I G. 29C
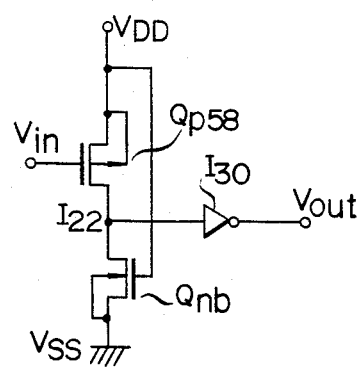

F I G. 37
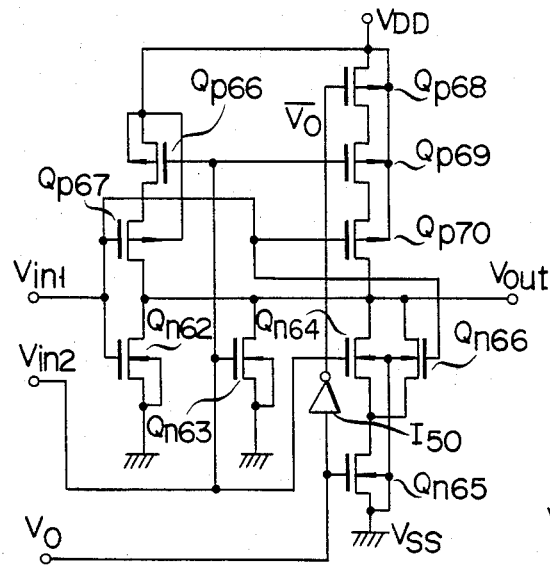
F I G. 39A
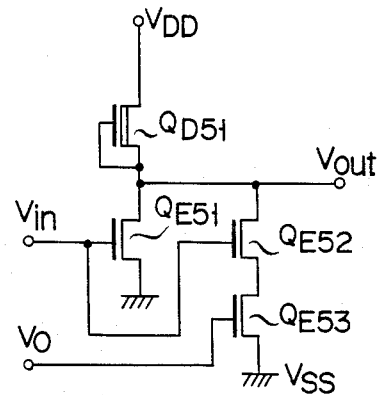
F I G. 38
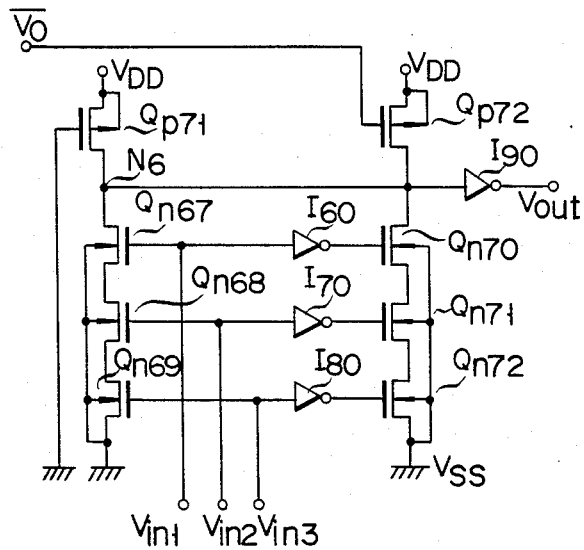
F I G. 39B
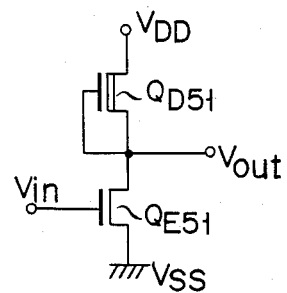

MOS LOGIC CIRCUIT RESPONSIVE TO AN IRREVERSIBLE CONTROL VOLTAGE FOR PERMANENTLY VARYING ITS SIGNAL TRANSFER CHARACTERISTIC

BACKGROUND OF THE INVENTION

This invention relates to a MOS logic circuit including MOS transistors and in particular to a MOS logic circuit capable of changing either its logic functions or changing its transfer signal characteristic without varying its logic functions by varying an output voltage of a voltage generating means in an irreversible fashion.

Where in a conventional MOS logic circuit there occurs a discrepancy between the expected difference in transmission speeds of a plurality of signals and the actual value obtained when the circuit is integrated, it is sometimes necessary to change the logic functions thereof. In the prior art techniques, once a logic circuit has been realized as an integrated circuit, if it is desired to change its logic functions, it is necessary to produce a new integrated circuit. In order to avoid such a time consuming effort, an attempt has been made at a circuit design step to prepare two sorts of circuit patterns, i.e., one having the originally designed logic function and the other having a changed logic function whose design modification is based on initially anticipated problems. In order to avoid producing a logical change to correct for a difference in transmission speeds of a plurality of signals, another attempt is made to design a MOS logic circuit with an excess signal transmission speed allowance or to design a MOS logic circuit by providing an excess allowance to the signal transmission time. However, as the circuit becomes larger in size, complicated in design and higher in circuit operation speed, the conventional method requires difficult to design circuit patterns and suffers a disadvantage of reducing the functionability of the circuit.

On the other hand, in a conventional MOS logic circuit, an input signal voltage/output signal voltage relation, a time variation ratio of the output signal voltage to the input signal voltage or a transmission time ratio of the output signal to the input signal is determined by the electrical characteristic of MOS transistors by which a logic circuit is made up. Once the input/output characteristic has been determined in the conventional MOS logic circuit, the input/output characteristic of the MOS logic circuit cannot be changed unless the process parameters relating to the electrical characteristic of the MOS transistors are varied, thus requiring an excess voltage allowance and excess time allowance and thus complicating the circuit design. As the circuit becomes larger in size and higher in packing density and operation speeds, it becomes more and more difficult to design a proper logic circuit with minimal excess redundancy.

SUMMARY OF THE INVENTION

It is therefore an object of this invention to provide a MOS logic circuit without any excess redundancy in design, of which the relation between an input signal and an output signal can be changed under the control of an irreversible control voltage.

It is another object of this invention to provide a MOS logic circuit without any excess redundancy in design, of which the logic function can be changed under the control of an irreversible control voltage.

It is another object of this invention to provide a MOS logic circuit without any excess redundancy in design, of which the signal transfer characteristic can be changed under the control of an irreversible control voltage with no change of the logic function thereof.

The MOS logic circuit in accordance with the invention comprises a known logic circuit, a control circuit connected to the known logic circuit, and a generating circuit for generating an irreversible voltage to be applied to the control circuit.

The MOS logic circuit in accordance with the invention comprises:

a MOS logic circuit means including at least a first and a second MOS field effect transistor, at least one gate electrode of which first and second MOS transistors being connected to a signal input terminal, each one end of both current paths of which first and second MOS transistors being mutually connected together to form a node for a signal output terminal, and which circuit means being coupled between a pair of power supply terminals;

a generator means including a fuse for generating an irreversible control voltage;

a control circuit means including at least a third MOS field effect transistor, the source-drain current path of which being series-connected between one of the power supply terminals and one of the other ends of the first and second MOS transistors, the gate electrode of which being connected to receive the irreversible control voltage derived from said generator means; and logic functions between the input/output signals of the MOS logic circuit being changed under the control of the control circuit means.

Further, the MOS logic circuit in accordance with the invention comprises:

a MOS logic circuit means which is coupled between a pair of power supply terminals, including at least a first and a second MOS field effect transistor, at least one gate electrode of which being connected to a signal input terminal and each one end of both current paths of which being mutually connected together to form a node for a signal output terminal, and a third MOS field effect transistor, the gate electrode of which being connected to the signal input terminal and the drain of which being connected to the node for the signal output terminal;

a generator means including a fuse for generating an irreversible control voltage;

a control circuit means including at least a fourth MOS field effect transistor, the gate electrode of which being connected to receive the irreversible control voltage derived from the generator means, and the source-drain current path of which being connected between one of the power supply terminals and the node through the source-drain current path of the third transistor; and signal transfer characteristics between input/output signals of the MOS logic circuit being changed under the control of the control circuit means with the logic functions thereof remaining unchanged.

Furthermore, the MOS logic circuit in accordance with the invention comprises:

a MOS logic circuit means which is coupled between a pair of power supply terminals, including at least a first and a second MOS field effect transistor, at least one gate electrode of which being connected to a signal input terminal and each one end of both current paths of the first and second MOS field effect transistors being mutually connected together to form a node for a signal output terminal;

a generator means including a fuse for generating an irreversible control voltage; and a control circuit means including at least a third MOS field effect transistor, the gate electrode of which being connected to receive the irreversible control voltage derived from the generator means, and the drain-source current path of which being connected between the node for the signal output terminal and one of the power supply terminals; and signal transfer characteristics between input/output signals of the MOS logic circuit being changed under the control of the control circuit with the logic functions thereof remaining unchanged.

According to this invention, there is an advantage that a MOS logic circuit without excess voltage allowance as well as excess circuit operation allowance may be obtained by way of introduction of the irreversible control voltage derived from the generator to change the input/output signal transfer characteristics with the logic functions thereof unchanged.

Another advantage in accordance with the invention is obtained in that, since the MOS logic circuit has the redundancy function of performing a change of logic functions by utilizing the irreversible control voltage derived from the generator, it is possible to avoid a design modification resulting from the presence or absence of a logic function change and thus to permit a simpler, proper circuit design without involving any excess redundancy.

BRIEF DESCRIPTION OF THE DRAWINGS

The MOS logic circuits according to this invention will be understood from the following descriptions, in which:

FIGS. 10 and 11 each show a circuit diagram of another embodiment belonging to the first category, in which the known C-MOS NAND gate is utilized;

FIGS. 12 and 13 each show a circuit diagram of another embodiment belonging to the first category, in which a known C-MOS NOR gate is utilized;

FIG. 17 shows a circuit diagram of another embodiment belonging to the first category, in which both known C-MOS NAND and NOR gates are utilized;

FIGS. 18, 19, 20, 21, 22 and 23 each show a circuit diagram of another embodiment belonging to the first category, in which a known enhancement/depletion type logic circuit is utilized;

FIGS. 24A to 24D and 25A to 25D each show circuit diagrams, equivalent circuit diagrams and transfer characteristic curves of one embodiment belonging to a second category, in which a known C-MOS inverter is utilized;

FIGS. 26A to 26C and 29A to 27E show circuit diagrams and equivalent circuits of another embodiment belonging to the second category, in which the known C-MOS inverter is employed;

FIGS. 28A to 28C and 28A to 29C show a circuit diagram and equivalent circuits of another embodiment belonging to the second category, in which a two-stage inverter is employed;

FIGS. 35 through 37 each show a circuit diagram of another embodiment belonging to the second category, in which a two-input C-MOS NOR gate is utilized;

FIG. 38 shows a circuit diagram of another embodiment belonging to the second category, in which a three-input C-MOS exclusive OR gate delay circuit is employed;

DETAILED DESCRIPTION OF THE PREFERRED EMBODIMENTS

A MOS logic circuit of this invention is broadly classified into the following two categories:

(1) A MOS logic circuit adapted to vary logic functions of a whole MOS logic circuit by varying an irreversible control voltage;

(2) A MOS logic circuit adapted to vary a signal transfer characteristic between the input/output signals thereof by varying an irreversible control voltage with the logic functions of a whole MOS logic circuit unchanged.

The preferred embodiments of the MOS logic circuit according to this invention will be explained hereinafter in connection with the first-mentioned category.

Figure 1:
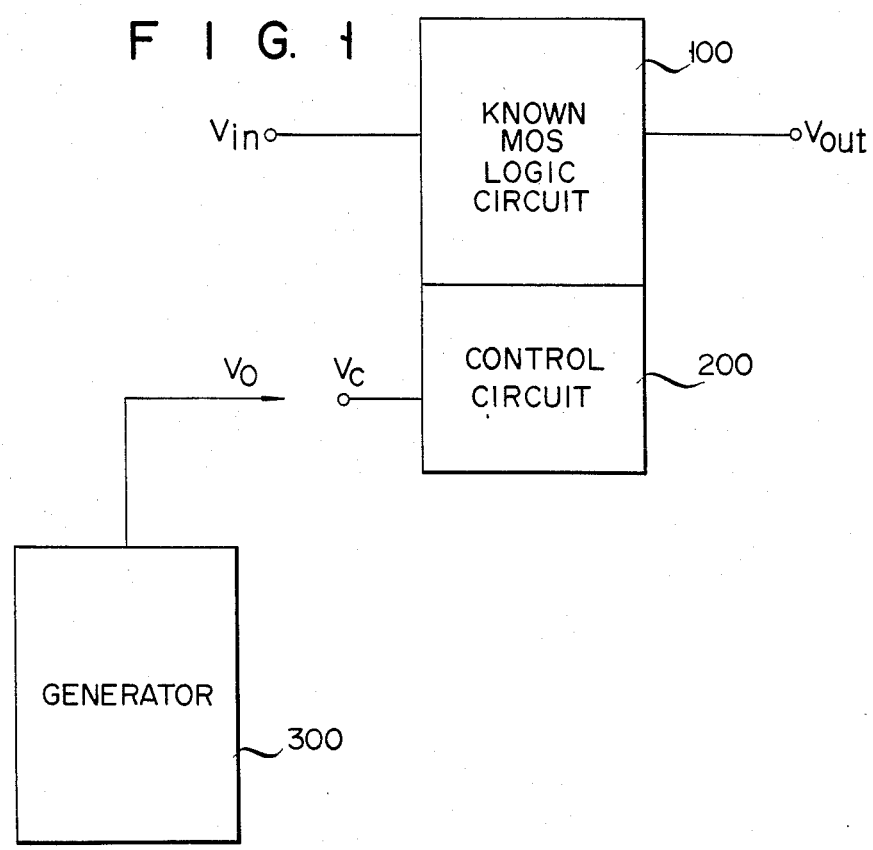
FIG. 1 is a schematic block diagram showing the conceptual function of the MOS logic circuit according to this invention.

FIG. 1 shows a block diagram of the basic construction of the above-mentioned MOS logic circuit which comprises a known MOS logic circuit 100, such as an AND gate, having an input Vin and an output Vout, a control circuit 200 connected to the known MOS logic circuit and having an input $V_C$, and a generating circuit 300 for producing an irreversible control voltage $V_O$ to be applied to the input $V_C$ of the control circuit 200. It should be understood in this specification that "irreversible control voltage" is a voltage which, once changed from an original value to a new value is then permanently fixed to this new value, that is to say, the value never reverts back to the original potential. This will be explained in more detail with reference to the embodiments.

Figure 2:
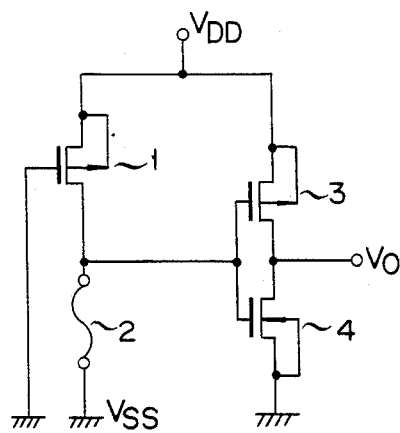
FIGS. 2 and 3 each show an example of a practical circuit diagram of the generating circuit for producing an irreversible control voltage shown in FIG. 1.
Figure 3:
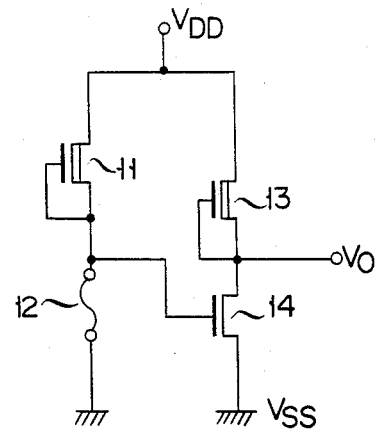

Referring to FIGS. 2 and 3, there are shown circuit diagrams of a typical generator 300 for producing an irreversible control voltage.

The generator shown in FIG. 2 is shown per se and has complementary MOS structure (hereinafter referred to as "C-MOS").

Between a power supply terminal $V_{DD}$ and a power supply terminal $V_{SS}$ (ground potential) are serially connected a current path of a p-channel MOS transistor 1 and a fuse element 2 made of an electrically or thermally blowable polysilicon connection layer, metal connection layer, etc. The gate of a MOS transistor 1 is connected to the terminal $V_{SS}$. p- and n-channel MOS transistors 3 and 4 have their current paths connected in series between the terminal $V_{DD}$ and $V_{SS}$ and their gates connected to a junction or a node of the MOS transistor 1 and fuse element 2. An irreversible control voltage $V_O$ is derived at the junction between the C-MOS transistors 3 and 4.

In the circuit as shown, if the fuse element 2 is not yet burned out, then the MOS transistor 3 is turned on and the MOS transistor 4 is turned off, causing the output voltage $V_O$ to become a voltage $V_H$ (high level) on the $V_{DD}$ side. If the fuse element 2 is burned out by directing a laser beam at the fuse element or flowing a large current therethrough, the MOS transistor 3 is turned off and the MOS transistor 4 is turned on, causing the output voltage $V_O$ to become a voltage $V_L$ (low level). With the fuse element 2 once blown out, it cannot be returned to the original state. That is, if the output voltage $V_O$ is changed into the voltage $V_L$ it is not possible to change it into the voltage $V_H$. Thus, it follows that a change from the voltage $V_H$ to the voltage $V_L$ is a so-called "irreversible voltage change".

The generator shown in FIG. 3 is also shown per se and has an enhancement/depletion structure (hereinafter referred to as "E/D"). In the circuit shown, the current paths of a depletion mode MOS transistor 11 and fuse element 12 are series-connected between a power supply terminal $V_{DD}$ and a power supply terminal $V_{SS}$. The gate of the MOS transistor 11 is connected to a junction, or a node of the MOS transistor 11 and fuse element 12. The current paths of a depletion mode MOS transistor 13 and enhancement mode or type MOS transistor 14 are connected in series between the power supply terminal $V_{DD}$ and the power supply terminal $V_{SS}$. The gate of one (i.e. the MOS transistor 14) of the MOS transistors 13 and 14 is connected to the junction mentioned. An irreversible control voltage $V_O$ is taken as an output from the junction of the MOS transistors 13 and 14.

If the fuse element 12 is not yet burned out, the MOS transistor 14 is turned off and an output voltage $V_O$ becomes a voltage $V_H$ (high level) on the $V_{DD}$ side. With the fuse element 12 burned out, the MOS transistor 14 is turned on and the output voltage $V_O$ becomes a voltage $V_L$ (low level) on the $V_{SS}$ side. In this case also, once the fuse element is burned out, it is not returned to the original state. With a change from the voltage $V_H$ to the voltage $V_L$ back is not possible to change it to the voltage $V_H$. The change is an irreversible change. Consequently, the resulting output voltage derived from this generator is an example of an "irreversible control voltage" as that term is used in this specification.

Figure 4:
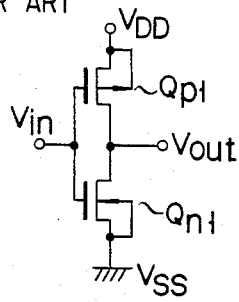
FIG. 4 shows a circuit diagram of a known C-MOS inverter.

FIG. 4 shows a circuit diagram of a known C-MOS inverter corresponding to the circuit 100 in FIG. 1. The C-MOS inverter as shown in FIG. 4 comprises a p-channel MOS transistor Qp1 having its source connected to a $V_{DD}$ supply terminal, its drain connected to an output Vout and its gate electrode adapted to receive an input signal Vin as a gate input signal, and an n-channel MOS transistor Qn1 having its source connected to a $V_{SS}$ supply terminal, its drain connected to the above-mentioned Vout, and its gate electrode adapted to receive the above-mentioned input signal Vin.

Table 1 shows the relation between the input voltage Vin and the output voltage Vout, and is analogous to the ordinary truth table where the voltages are represented by the logical values "1" and "0". Accordingly, it will be called "a truth table".

TRUTH TABLE 1

|  | Vout | |
|---|---|---|
| Vin | H | L |
|  | L | H |

In connection with this truth table, the definition on "H" and "L" is given:
"H" is the voltage which has logically "High" level, and
"L" is the voltage which has logically "Low" level.

Now the circuit diagrams shown in FIG. 5 through FIG. 8 represent a part of the embodiment according to the invention. It can be easily seen from these circuit diagrams that they represent the combination of circuit arrangements 100 and 200 in FIG. 1, with the generator 300 omitted.

Figure 5:
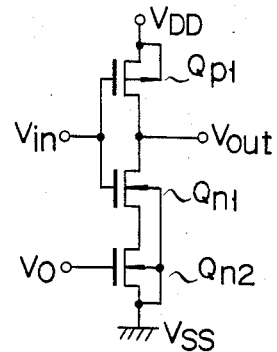
FIGS. 5, 6, 7 and 8 each show a circuit diagram of a preferred embodiment belonging to a first category, in which the known C-MOS inverter is utilized.

This MOS logic circuit, as shown in FIG. 5, according to an embodiment of this invention includes a known C-MOS inverter consisting of MOS transistors Qp1 and Qn1, the drains of which are mutually connected to form a node for the output terminal Vout, the source of which transistor Qp1 is connected to one of the supply terminals $V_{DD}$, and both gate electrodes of which are mutually connected together to receive the input signal Vin, and an additional n-channel MOS transistor Qn2. In this circuit, the transistor Qn2 corresponding to the control circuit 200 in FIG. 1, has its drain connected to the source of the MOS transistor Qn1, its source connected to one of the supply terminals $V_{SS}$, and its gate electrode connected to the output voltage $V_O$ (=irreversible voltage) of the generator 300 in FIG. 1, such as the actual generator in FIG. 2. Namely, the drain to source current path or channel of the MOS transistor Qn2 is connected to the node for the output terminal Vout through that of the MOS transistor Qn1. Each gate electrode of both MOS transistors Qp1 and Qn1 is mutually connected together to the signal input terminal Vin, the same as is done in FIG. 4 with a known C-MOS inverter, and the source of transistor Qp1 is connected to the other of the supply terminals $V_{DD}$. Here, the same reference numerals as shown in FIG. 4 will be employed to denote the same circuit elements corresponding to those shown in the following Figures. In the operation of the circuit as shown in FIG. 5, when $V_O=V_H$, the MOS transistor Qn2 is always turned on and at this time the logical relation is as shown in Truth Table 2, i.e. the same as in an ordinary C-MOS inverter. When $V_O=V_L$, the MOS transistor Qn2 is always turned off. With the input signal Vin at the "L" level, the MOS transistor Qp1 turns on and thus an output signal Vout becomes an "H" level. With Vin at the high level, the output Vout becomes a high impedance condition, i.e. the "undefined" or "indeterminate" state.

TRUTH TABLE 2

|  |  | Vout | |
|---|---|---|---|
|  |  | $V_O=V_H$ | $V_O=V_L$ |
| Vin | H | L | X (indeterminate) |
|  | L | H | H |

It should be noted that "$V_H$" of the irreversible voltage is the voltage of which level is logically "High", and "$V_L$" is the voltage of which level is logically "Low".

Figure 6:
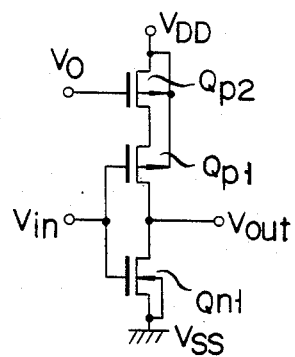

FIG. 6 shows a MOS logic circuit according to a modified form of the first-explained embodiment. Although in the first embodiment an n-channel MOS transistor for receiving the irreversible voltage $V_O$ as a gate input signal has been connected in series with the n-channel MOS transistor Qn1 of the C-MOS inverter, a source-drain current path of a p-channel MOS transistor Qp2 is additionally inserted between the node through that of the p-channel MOS transistor Qp1 and supply terminal $V_{DD}$ and the output voltage $V_O$ of the circuit 300 as shown in FIG. 1 is applied to the gate of the MOS transistor Qp2. In this embodiment, when the irreversible control voltage $V_O=V_L$, the MOS transistor is always turned on, and the logic function is as shown in Table 3, i.e. the same as in an ordinary C-MOS inverter. At $V_O=V_H$, the MOS transistor Qp2 is always turned off. With an input Vin at the "H" level, the MOS transistor Qn1 turns on, the output signal Vout becomes an "L" level. With Vin at the "L" level, the output Vout becomes similarly a high impedance state and thus the "indeterminate" state as shown in Truth Table 3.

TRUTH TABLE 3

|  |  | Vout | |
|---|---|---|---|
|  |  | $V_O=V_L$ | $V_O=V_H$ |
| Vin | H | L | L |
|  | L | H | X |

Figure 7:
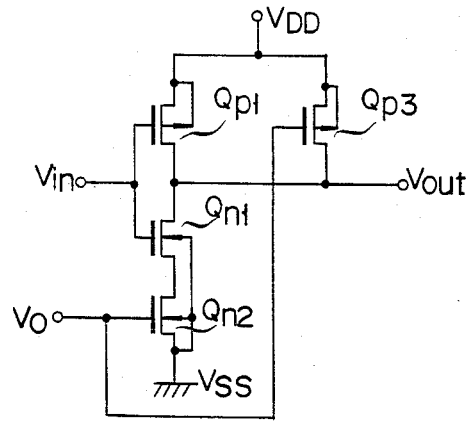
Figure 8:
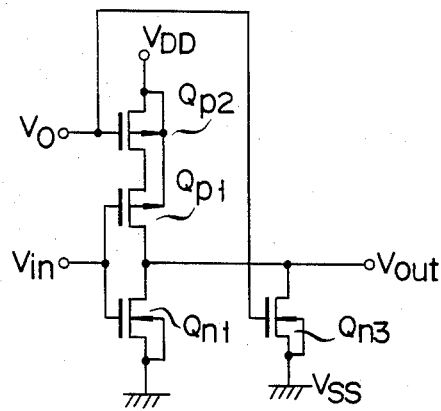

FIGS. 7 and 8, each, show a MOS logic circuit according to another modification of the before-mentioned embodiments, by which the "undefined" or "indeterminate" state can be eliminated. In the modification as shown in FIG. 7 an n-channel MOS transistor Qn2 is inserted the same as in the embodiment of FIG. 5 and additionally a source-drain current path, or channel of a p-channel MOS transistor Qp3 is series-connected between the output terminal Vout and the supply terminal $V_{DD}$ to permit the output voltage $V_O$ of the generator 300 as shown in FIG. 1 to be applied in parallel to both gate electrodes of the MOS transistors Qn2 and Qp3. At $V_O=V_H$ the MOS transistor Qn2 is turned on and the MOS transistor Qp3 is turned off, performing a logical operation as in an ordinary C-MOS inverter. When $V_O=V_L$, the MOS transistor Qn2 is turned off, interrupting the current path from Vout to $V_{SS}$, and the MOS transistor Qp3 is turned on, establishing a current path from $V_{DD}$ to Vout. As a result, a logic function of this circuit is as shown in Truth Table 4.

TRUTH TABLE 4

|  |  | Vout | |
|---|---|---|---|
|  |  | $V_O=V_H$ | $V_O=V_L$ |
| Vin | H | L | H |
|  | L | H | H |

In the modification the shown in FIG. 8, a p-channel MOS transistor Qp2 is provided as same as in the modification of FIG. 6, and additionally a drain-source current path of an n-channel MOS transistor Qn3 is series-connected between the node or the output terminal Vout and the output terminal $V_{SS}$. The irreversible voltage $V_O$ of the generator 300 as shown in FIG. 1 is applied in parallel to both gate electrodes of the MOS transistors Qp2 and Qn3, and the logic function of the circuit is as shown in Truth Table 5.

TRUTH TABLE 5

|  |  | Vout | |
|---|---|---|---|
|  |  | $V_O=V_L$ | $V_O=V_H$ |
| Vin | H | L | L |
|  | L | H | L |

Next a MOS logic circuit having two or more input terminals will be explained.

Before proceeding with the description on the two-input MOS logic circuit according to this invention, a known two-input C-MOS NAND gate will be described below with reference to FIG. 9.

Figure 9:
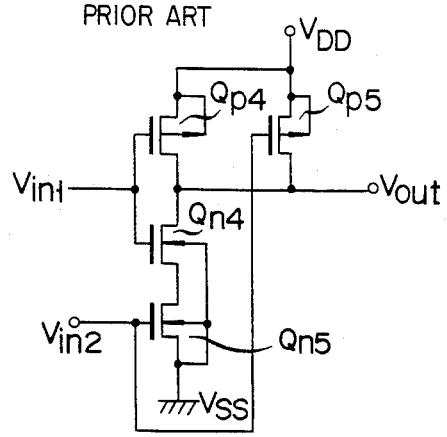
FIG. 9 shows a circuit diagram of a known two-input type C-MOS NAND circuit.

In the circuit of FIG. 9 p-channel MOS transistors Qp4 and Qp5 have their source-drain current paths connected in parallel between a terminal $V_{DD}$ and a node or an output Vout and are adapted to receive input signals Vin1 and Vin2 as gate input signals, respectively. N-channel MOS transistors Qn4 and Qn5 have their drain-source current paths connected in series between the node or the output Vout and a terminal $V_{SS}$ and are adapted to receive the input signals Vin1 and Vin2 as gate input signals.

The logic function of this circuit is as indicated in Truth Table 6.

TRUTH TABLE 6

|  |  | Vin1 | |
|---|---|---|---|
|  |  | H | L |
| Vin2 | H | L | H |
|  | L | H | H |

FIG. 10 shows a circuit diagram of a MOS logic circuit embodying this invention by utilizing the two-input C-MOS NAND gate of FIG. 9. In this circuit, the drain-source current path of an additional p-channel MOS transistor Qp6 is series-connected between the supply terminal $V_{DD}$ and output terminal Vout through that of the MOS transistor Qp5. The irreversible control voltage $V_O$ of generator 300 of FIG. 1 is applied to the gate electrode of the MOS transistor Qp6. In this circuit, at $V_O=V_L$ the MOS transistor Qp6 is always turned on and, therefore, a current path leading from $V_{DD}$ to Vout through the transistors Qp6 and Qp5 is determined by the ON-OFF control of the MOS transistor Qp5. At this time, the logic function is as shown in Truth Table 7, i.e. the same as in an ordinary two-input C-MOS NAND gate. When $V_O=V_H$, the MOS transistor Qp6 is always turned off. With MOS transistor Qp4 turned off and the MOS transistor Qp5 on, that is, with Vin1=an H level and Vin2=an L level, a current path from $V_{DD}$ to Vout is interrupted and also a current path from $V_{SS}$ to Vout is interrupted, causing the output Vout to come to a high impedance state. The output Vout becomes an "indeterminate" state as shown in Truth Table 7.

TRUTH TABLE 7

|  |  | $V_O=V_L$ Vin1 | | $V_O=V_H$ Vin1 | |
|---|---|---|---|---|---|
|  |  | H | L | H | L |
| Vin2 | H | L | H | L | H |
|  | L | H | H | X | H |

FIG. 11 shows a modified form of the embodiment as shown in FIG. 10, eliminating the "indeterminate" state of the logic from it. The circuit of FIG. 11 employs an additional a MOS transistor Qp6 and an n-channel MOS transistor Qn6. The source-drain current path of transistor Qp6 is series-connected between the supply terminal $V_{DD}$ and the output terminal $V_{DD}$ through the source-drain current path of transistor Qp5. The source-drain current path of transistor Qn6 is connected in parallel with that of transistor Qn5, and the gate electrodes of transistors Qp6 and Qn6 are mutually connected to receive the irreversible control voltage from the generator 300 in FIG. 1. In this circuit, when $V_O=V_L$ the MOS transistor Qn6 is always turned off and the MOS transistor Qp6 is always turned on. In this case, the logic function is as shown in Truth Table 8, i.e. the same as in an ordinary two-input C-MOS NAND gate. With $V_O=V_H$, the MOS transistor Qn6 is always turned on. If under this condition, the MOS transistor Qn4 is turned on (Vin1="H" level), a current path from Vout to $V_{SS}$ is established. On the other hand, since the MOS transistor Qp6 is always turned off, when Vin2 becomes an L level, a current path from $V_{DD}$ to Vout is not created even if MOS transistor Qp5 is turned on. The logic function of the MOS logic circuit is as shown in Truth Table 8.

TRUTH TABLE 8

|  |  | $V_O=V_L$ Vin1 | | $V_O=V_H$ Vin1 | |
|---|---|---|---|---|---|
|  |  | H | L | H | L |
| Vin2 | H | L | H | L | H |
|  | L | H | H | L | H |

FIG. 12 shows a circuit diagram of a MOS logic circuit embodying this invention by utilizing a two-input C-MOS NOR gate. A drain-source current path of an n-channel MOS transistor Qn9 for receiving $V_O$ as a gate input signal is inserted between a $V_{SS}$ supply terminal and the output node Vout through the source-drain current path of an n-channel MOS transistor Qn8 which, together with an n-channel MOS transistor Qn7 and p-channel MOS transistors Qp7 and Qp8, constitutes an ordinary NOR gate. When $V_O=V_H$, the MOS transistor Qn9 is always turned on and the logic function of Vout to Vin1 and Vin2 is the same as in the ordinary two-input C-MOS NOR gate, as shown in Truth Table 9 below. It $V_O=V_L$, the MOS transistor Qn9 is always turned off. With the MOS transistor Qn7 OFF and MOS transistor Qn8 ON, i.e. with Vin1=an L level and Vin2=an H level, a current path from Vout to $V_{SS}$, as well as a current path from $V_{DD}$ to Vout, are cut off and thus the output Vout becomes a high impedance state, i.e. an indeterminate state as indicated in Truth Table 9.

TRUTH TABLE 9

|  |  | $V_O=V_H$ Vin1 | | $V_O=V_L$ Vin1 | |
|---|---|---|---|---|---|
|  |  | H | L | H | L |
| Vin2 | H | L | L | L | X |
|  | L | L | H | L | H |

FIG. 13 shows a MOS logic circuit according to a modified form of the embodiment of FIG. 12, in which the indeterminate state of the logic of the above-mentioned embodiment can be eliminated. In this MOS logic circuit, a MOS transistor Qn9 is inserted. The drain-source current path of p-channel transistor Qp9 is connected in parallel with that of a MOS transistor Qp7, and $V_O$ is supplied to the gate electrode of the MOS transistor Qp9. When $V_O=V_L$, the MOS transistor Qp9 is always turned on. With the MOS transistor Qp8 turned on, a current path from the terminal $V_{DD}$ to an output Vout is established. As the MOS transistor Qn9 is always turned off even if Vin2 becomes an H level and MOS transistor Qn8 is turned on, a current path from the output Vout to $V_{SS}$ is not established. Therefore, the logic function of this circuit is as indicated in Truth Table 10 below.

TRUTH TABLE 10

|  |  | $V_O=V_H$ Vin1 | | $V_O=V_L$ Vin1 | |
|---|---|---|---|---|---|
|  |  | H | L | H | L |
| Vin2 | H | L | L | L | H |
|  | L | L | H | L | H |

Figure 14:
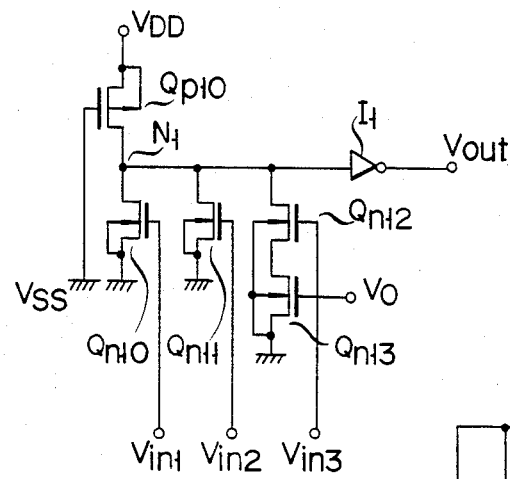
FIG. 14 shows a circuit diagram of another embodiment belonging to the first category, in which a known C-MOS OR type delay circuit is utilized.

FIG. 14 shows a MOS logic circuit according to another embodiment this invention. This circuit includes an ordinary C-MOS OR type delay circuit comprising a p-channel MOS transistor Qp10 having its source-drain current path connected between one of the supply terminal $V_{DD}$ and a node N1 and its gate connected to another supply terminal $V_{SS}$ and acting as a load transistor. Three n-channel MOS transistors Qn10, Qn11 and Qn12 have their drain-source current paths connected in parallel between the node N1 and the terminal $V_{SS}$, and are adapted to receive gate input signals Vin1, Vin2 and Vin3, respectively. These transistors serve as driver transistors. A C-MOS inverter I1 is provided for inverting a signal on the node N1 to obtain an output signal Vout, and the drain-source current path of an n-channel MOS transistor Qn13 is series-connected with MOS transistor Qn12 between the node N1 and the terminal $V_{SS}$. The gate electrode of transistor Qn13 is adapted to receive the irreversible voltage $V_O$ as a gate input signal.

It should be noted that the meaning of the "load transistor" should be understood in this specification as referring to a transistor for which the gate electrode is connected to the source, the drain thereof to one of a pair of supply terminals $V_{DD}$, $V_{SS}$ and which is usually turned on, and also that of a "driver transistor" should be considered a transistor for which the gate electrode is connected to a signal input terminal.

Now assuming that in this circuit the irreversible control voltage $V_O$ is at a level $V_H$, the MOS transistor Qn13 is always turned on. If in this case any one of the signals Vin1, Vin2 and Vin3 becomes an H level, an output signal Vout becomes an H level after a given delay time, and thus this circuit works as a three-input OR type delay circuit. It is to be noted here that the ratio of conductance of the three n-channel MOS transistors Qn10, Qn11 and Qn12 to that of a p-channel MOS transistor Qp10 should be predetermined to have, even if any of the three n-channel MOS transistors Qn10, Qn11 and Qn12 is turned on, "drivability" enough to effect a signal inversion of the inverter I1 from $V_L$ to $V_H$. When $V_O=V_L$, the MOS transistor Qn13 is turned off. In this case, even if any signal is supplied as a gate input signal Vin3 to the gate electrode of the MOS transistor Qn12 connected in series with the MOS transistor Qn13, no influence is given to the node N1 and thus the circuit as a whole serves as a two-input OR type delay circuit. As appreciated from the above, the circuit of this embodiment serves as a three-input or a two-input OR type delay circuit (i.e. two kinds of logic functions).

Figure 15:
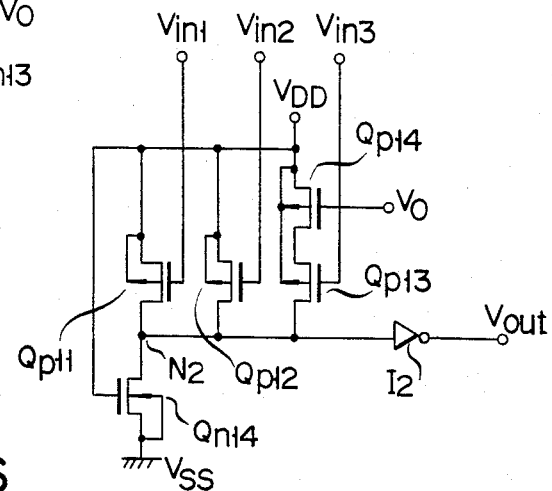
FIG. 15 shows a circuit diagram of another embodiment belonging to the first category, in which a known C-MOS AND type delay circuit is utilized.

FIG. 15 shows a MOS logic circuit according to another embodiment of this invention, in which a C-MOS AND type delay circuit is utilized. This circuit includes an ordinary C-MOS AND type delay circuit constituted by an n-channel MOS transistor Qn14 having its drain-source current path connected between a node N2 and a terminal $V_{SS}$, its gate electrode connected to a terminal $V_{DD}$ and functioning as a load transistor. Three p-channel transistors Qp11, Qp12 and Qp13 have their source-drain current paths connected in parallel between the terminal $V_{DD}$ and the node N2 and their gate electrodes connected to receive input signals Vin1, Vin2 and Vin3, respectively. These transistors serve as a driver transistor. A C-MOS inverter I2 is provided for inverting a signal on the node N2 to obtain an output signal Vout, and p-channel MOS transistor Qp14 is additionally series connected with its drain-source current path to that of the MOS transistor Qp13 between the node N2 and the supply terminal $V_{DD}$. The gate electrode of transistor Qp14 is connected to receive the irreversible control voltage.

When the irreversible control voltage $V_O$ is equal to $V_L$, the MOS transistor Qp14 is always turned on. If any one of the input signals Vin1, Vin2 and Vin3 are an L level, an output signal Vout becomes an L level. It should be noted, however, that the ratio of the conductance of the three p-channel MOS transistors Qp11, Qp12 and Qp13 to that of the n-channel MOS transistor Qn14 should be initially determined to have, even if any of the p-channel MOS transistors Qp11, Qp12 and Qp13 is turned on, such drivability so as to invert an input signal of the inverter I2. When, on the other hand, $V_O=V_H$, the MOS transistor Qp14 is turned off. Even if an input signal of any level is supplied as a gate input signal Vin3 to the gate electrode of the MOS transistor Qp13 connected in series with the MOS transistor Qp14, no influence is given to the node N2 and the circuit acts as a two-input (Vin1 and Vin2) AND type delay circuit. The logic functions of this circuit can be chosen to be either a three-input or two-input AND type delay circuit by controlling the irreversible voltage $V_O$.

Figure 16:
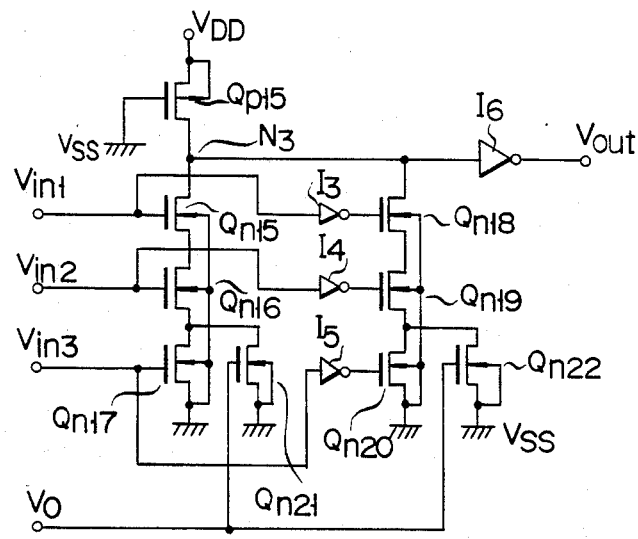
FIG. 16 shows a circuit diagram of another embodiment belonging to the first category, in which a known C-MOS exclusive OR gate is utilized.

FIG. 16 shows a MOS logic circuit of another embodiment according to this invention, in which an ordinary C-MOS exclusive OR type circuit is used. This MOS logic circuit includes an ordinary C-MOS exclusive-OR gate comprising a p-channel MOS transistor Qp15 having its source-drain current path series-connected between a terminal $V_{DD}$ and a node N3 and its gate connected to a terminal $V_{SS}$ and serving as a load transistor; and three n-channel MOS transistors Qn15, Qn16 and Qn17 having their drain-source current paths connected in series between the node N3 and the terminal $V_{SS}$ and their gate electrodes connected to receive input signals Vin1, Vin2 and Vin3, respectively, and acting as driver transistors. Furthermore, the circuit of FIG. 16 includes three n-channel MOS transistors Qn18, Qn19 and Qn20 connected in series between the node N3 and the supply terminal $V_{SS}$ with their gate electrodes connected, respectively, through C-MOS inverters I3, I4 and I5 to receive input signals Vin1, Vin2 and Vin3; and a C-MOS inverter I6 connected between the node N3 and the output terminal Vout for inverting an input on the node N3 to obtain an output signal Vout. An n-channel MOS transistor Qn21 having drain-source current path is connected in parallel with that the MOS transistor Qn17 is connected to receive the irreversible control voltage $V_O$ as a gate input signal, and an n-channel MOS transistor Qn22 having its drain-source current path connected parallel to that of the MOS transistor Qn20 is also connected to receive the $V_O$ as a gate input. When $V_O=V_L$ in this circuit, the MOS transistors Qn21 and Qn22 are always turned off and therefore the circuit of this embodiment works as a three-input Exclusive-OR circuit. When $V_O=V_H$, the MOS transistors Qn21 and Qn22 are always turned on and the input signal Vin3 cannot give influence to their operations. That is, transistors Qn17 and Qn20 are short-circuited by the transistors Qn21 and Qn22, respectively. In this case, the circuit of the embodiment acts as a two-input Exclusive-OR circuit.

FIG. 17 is a circuit diagram of a C-MOS logic circuit of another embodiment according to this invention, in which two kinds of logic circuits (functions) are realized: a NOR gate and a NAND gate. In this circuit, two p-channel MOS transistors Qp16 and Qp17 have their source-drain current paths connected in series between one terminal $V_{DD}$ and the node for the output Vout and are adapted to receive input signals Vin1 and Vin2 as gate input signals, respectively. Two n-channel MOS transistors Qn23 and Qn24 have their drain-source current paths connected in series between the node for the output Vout and the other terminal $V_{SS}$ and are adapted to receive input signals Vin1 and Vin2 as gate input signals. As a result, a series arrangement of the p-channel transistors Qp16 and Qp17 and n-channel transistors Qn23 and Qn24 is connected in series between a pair of the supply terminals $V_{DD}$ and $V_{SS}$. This circuit further includes a series arrangement connected between a pair of the supply terminals $V_{DD}$ and $V_{SS}$ of p-channel transistors Qp19 and Qp20 as well as n-channel transistors Qn26 and Qn27, both gate electrodes of which transistors Qp19 and Qn26 are connected to that of transistor Qp17 and Qn24, and both drains of which are connected to the node for the output Vout. Finally the circuit of FIG. 17 includes a p-channel transistor Qp18 having a source-drain current path connected parallel to that of the transistor Qp17, and an n-channel transistor Qn25 having a drain-source current path connected parallel to that of the transistor Qn24, each gate electrode of which being mutually connected to that of transistors Qp20 and Qn27, respectively, to receive the irreversible control voltage $V_O$ derived from the generator 300 in FIG. 1.

When the irreversible control voltage $V_O$ is at the level $V_L$, the n-channel MOS transistors Qn25 and Qn27 are always turned off. A current path from Vout to $V_{SS}$ is created by a series circuit of the n-channel MOS transistors Qn23 and Qn24 connected to receive input signals Vin1 and Vin2 as gate input signals. Simultaneously, since the p-channel MOS transistors Qp18 and Qp20 are turned on, the current paths from $V_{DD}$ to Vout are established in parallel with one through the p-channel MOS transistor Qp16 and one through the p-channel MOS transistor Qp19, the MOS transistors Qp16 and Qp19 being connected to receive the input signals Vin1 and Vin2 as gate input signals. Thus, the circuit serves as an ordinary C-MOS NAND gate. On the other hand, since at $V_O=V_H$ the n-channel MOS transistors Qn25 and Qn27 are always turned on, two current paths from Vout to $V_{SS}$ are created in parallel with one through the n-channel MOS transistor Qn23 and one through the n-channel MOS transistor Qn26, the gate electrodes of the MOS transistors Qn23 and Qn26 being connected to receive the input signals Vin1 and Vin2, respectively. Simultaneously, when the $V_O=V_H$, the p-channel MOS transistors Qp18 and Qp20 are always turned off and thus a current path from Vout to $V_{DD}$ is constituted by a series circuit of the p-channel MOS transistors Qp16 and Qp17 for receiving the input signals Vin1 and Vin2 as gate input signals, respectively. Thus, the circuit functions in the same way as an ordinary C-MOS NOR gate. As a result, the circuit has two kinds of logic functions under the control of $V_O$, as shown in Truth Table 11 below.

TRUTH TABLE 11

|  |  | $V_O=V_H$ Vin1 |  | $V_O=V_L$ Vin1 |  |
|---|---|---|---|---|---|
|  |  | H | L | H | L |
| Vin2 | H | L | L | L | H |
|  | L | L | H | H | H |
| Kinds of logics |  | NOR |  | NAND |  |

So far the C-MOS type logic circuits have been explained in connection with the embodiments and modified embodiments. Enhancement/Depletion type logic circuits will now be explained in which a depletion type MOS transistor is used as the load transistor and an enhancement type MOS transistor is used as a driver transistor.

FIGS. 18 and 23 each show a MOS logic circuit according to the embodiments of this invention in which an ordinary E/D type MOS logic circuit is used. The MOS logic circuit as shown in FIG. 18 includes the ordinary E/D type inverter comprising a depletion type MOST transistor $Q_{D1}$ having its source-drain current path, or channel connected between one of the supply terminals $V_{DD}$ and an output Vout and its gate electrode connected to Vout Thus, transistor $Q_{D1}$ serves as a load transistor. An enhancement type MOS transistor $Q_{E1}$ having its source-drain current path connected between the other supply terminal $V_{SS}$ (through enhancement type transistor $Q_{E2}$) and the output Vout and its gate electrode connected to receive an input signal Vin, serves as a driver transistor. The drains of transistors $Q_{D1}$ and $Q_{E2}$ serve the node for the output terminal Vout. It further includes as the control circuit 200 in FIG. 1 an enhancement type MOS transistor $Q_{E2}$, the drain-source current path of which being connected between the source of the MOS transistor $Q_{E1}$ of the inverter and the supply terminal $V_{SS}$ and the gate electrode of which being connected to the output voltage $V_O$ of the irreversible control circuit 300 in FIG. 1 (e.g. the actual generator circuit shown in FIG. 3).

When $V_O=V_H$ in this circuit, the MOS transistor $Q_{E2}$ is always turned on. When the input signal Vin becomes an H level, the MOS transistor $Q_{E1}$ is turned on and the output Vout becomes a low voltage level i.e., the L level as determined by a ratio between the series conductance of the MOS transistors $Q_{E1}$, $Q_{E2}$ and the conductance of the MOS transistor $Q_{D1}$. While, on the other hand, the input signal Vin becomes L level, the MOS transistor $Q_{E1}$ is turned off, causing the output Vout to become an H level. Then, when $V_O=V_L$, the MOS transistor $Q_{E2}$ is always turned off, causing the output Vout to always become the H level independent of the input signal Vin. Consequently, the circuit has two kinds of the logical functions, as indicated in Truth Table 12, under the control of the irreversible voltage $V_O$.

TRUTH TABLE 12

|  |  | Vout |  |
|---|---|---|---|
|  |  | $V_O=V_H$ | $V_O=V_L$ |
| Vin | H | L | H |
|  | L | H | H |

FIG. 19 is a modified form of the above-mentioned embodiment. In this circuit, a drain-source current path of a MOS transistor $Q_{E2}$ is inserted between an output Vout, through the source-drain current path of the transistor $Q_{E1}$ and terminal $V_{SS}$, and a drain-source current path of a depletion type MOS transistor $Q_{D2}$ is connected between the node Vout, through the source-drain current path of the depletion type MOS transistor $Q_{D1}$, and the supply terminal $V_{DD}$, a voltage $V_O$ being supplied to the gate electrodes of the MOS transistors $Q_{E2}$, $Q_{D2}$.

It should be noted here that the voltage "$V_O'$" is set to either a value "$V_H'$" greater than the threshold value of the enhancement type MOS transistor $Q_{E2}$, or a value "$V_L'$" less than the threshold value of the depletion type MOS transistor $Q_{D2}$.

When $V_O'=V_H'$ in this circuit, the MOS transistors $Q_{E2}$ and $Q_{D2}$ are both turned on and thus the circuit is operated the same as in an ordinary E/D type inverter. When, on the other hand, $V_O'=V_L'$, the MOS transistors $Q_{E2}$ and $Q_{d2}$ are both turned off, cutting off two current paths, one between Vout and $V_{DD}$ and other between Vout and $V_{SS}$. As a result, the output terminal Vout becomes a high impedance state, i.e. an indeterminate state. Consequently, the circuit has two kinds of logical functions, as indicated in Truth Table 13, under the control of the irreversible voltage.

TRUTH TABLE 13

|  |  | Vout |  |
|---|---|---|---|
|  |  | $V_O'=V_H'$ | $V_O'=V_L'$ |
| Vin | H | L | X |
|  | L | H | X |

FIG. 20 shows a MOS logic circuit according to an embodiment of this invention, using an ordinary E/D type NAND gate. The circuit includes the ordinary E/D type NAND gate comprising a depletion type MOS transistor $Q_{D3}$ having its source-drain current path connected between a $V_{DD}$ supply terminal and an output Vout and its gate electrode connected to Vout for serving as a load transistor, and two enhancement type MOS transistors $Q_{E3}$ and $Q_{E4}$ having their drain-source current paths connected in series between the output Vout and a terminal $V_{SS}$ and their gates connected to receive input signals Vin1 and Vin2, respectively, and serving as driving transistors. The drain-source current path of an enhancement type MOS transistor $Q_{E5}$ is connected in parallel with that of the MOS transistor $Q_{E3}$ and the gate electrode thereof is connected to receive the output voltage $V_O$ of the generator 300. With $V_O=V_L$, the MOS transistor $Q_{E5}$ is always turned off and, only when input signals Vin1 and Vin2 become the H levels, the output Vout becomes an L level. In this way, the circuit works as the ordinary NAND gate. When, on the other hand, $V_O=V_H$, the MOS transistor $Q_{E5}$ is always turned on. In this case, the output Vout becomes irrelevant to the signal Vin2 and the circuit works merely as an inverter for Vin1. As a consequence, the circuit has two kinds of logical functions, as shown in Truth Table 14, on account of the presence of $V_O$.

TRUTH TABLE 14

|  |  | $V_O=V_L$ Vin1 | | $V_O=V_H$ Vin1 | |
|---|---|---|---|---|---|
|  |  | H | L | H | L |
| Vin2 | H | L | H | L | H |
|  | L | H | H | L | H |

FIG. 21 shows a MOS logic circuit according to another embodiment of this invention, using an ordinary E/D type NOR gate. This circuit includes the ordinary E/D type NOR circuit comprising a depletion type MOS transistor $Q_{D4}$ having its source-drain current path connected between one terminal $V_{DD}$ and a node for an output Vout and its gate electrode connected to the node for the output Vout and functioning as a load transistor, two enhancement type MOS transistors $Q_{E6}$ and $Q_{E7}$ having their drain-source current paths connected in parallel between the node for the output Vout and the other terminal $V_{SS}$ and their gate electrodes connected to receive input signals Vin1 and Vin2, respectively, and functioning as driver transistors, and an enhancement type MOS transistor $Q_{E8}$ having its drain-source current path connected between the node, through the source-drain current path of the MOS transistor $Q_{E7}$, and the other terminal $V_{SS}$ and its gate electrode connected to the irreversible control voltage $V_O$ of the generator 300 as shown in FIG. 1.

With $V_O=V_H$ and thus the MOS transistor $Q_{E8}$ turned on, this MOS logic circuit acts as an ordinary NOR gate. Since in this case the two MOS transistors $Q_{E7}$ and $Q_{E8}$ are connected in series between Vout and $V_{SS}$, it is necessary to determine properly the conductance ratio of the transistor $Q_{D4}$ to the series-connected transistors $Q_{E7}$ and $Q_{E8}$ in order that when the transistor $Q_{E7}$ is turned on upon receipt of an "H" level signal of Vin2, the level of the output Vout can become low. With $V_O=V_L$ and the MOS transistor $Q_{E8}$ turned off, the output Vout is determined by the input signal Vin1 irrespective of the input signal Vin2, and when the input signal Vin1 becomes an "H" level or an "L" level, the output Vout becomes an "L" level or an "H" level, respectively. In this case, the circuit works merely as an inverter. As a consequence, the circuit has two kinds of logic functions, as shown in Truth Table 15 owing to $V_O$.

TRUTH TABLE 15

|  |  | $V_O=V_H$ Vin1 | | $V_O=V_L$ Vin1 | |
|---|---|---|---|---|---|
|  |  | H | L | H | L |
| Vin2 | H | L | L | L | H |
|  | L | L | H | L | H |

FIG. 22 shows a MOS logic circuit according to an embodiment of this invention. This circuit includes firstly an ordinary three-input E/D type Exclusive-OR gate comprising a depletion type MOS transistor $Q_{D5}$ functioning as a load transistor, having its a source-drain current path connected between one terminal $V_{DD}$ and a node N4 and its gate electrode connected to the node N4; and three depletion type MOS transistor $Q_{E9}$, $Q_{E10}$ and $Q_{E11}$ functioning as driver transistors having their drain-source current paths connected in series between the node N4 and the other terminal $V_{SS}$ and their gate electrodes connected to receive input signals Vin1, Vin2 and Vin3, respectively, and secondly three depletion type MOS transistors $Q_{E12}$, $Q_{E13}$ and $Q_{E14}$ functioning as driver transistors having their drain-source current paths connected in series between the node N4 and the other terminal $V_{SS}$ and their gate electrodes connected, respectively, via E/D type inverters I7, I8 and I9 to receive input signals Vin1, Vin2 and Vin3 thirdly an E/D type inverter I10 for inverting a signal on the node N4 to obtain an output signal Vout; and fourthly, two enhancement type MOS transistors $Q_{E15}$ and $Q_{E16}$ having their drain-source current paths connected in parallel with that of the transistors $Q_{E11}$ and $Q_{E14}$, respectively, and their gate electrodes connected together to receive the irreversible control voltage $V_O$ derived from the generator 300 in FIG. 1. With $V_O=V_L$ and thus the MOS transistors $Q_{E15}$ and $Q_{E16}$ turned off, an output Vout becomes an "H" level if the input signals Vin1, Vin2 and Vin3 become all the "H" levels or the "L" levels. In this case, the circuit serves as an ordinary three-input exclusive OR gate logic circuit. It is to be noted here that, if one series-arrangement of the three MOS transistors $Q_{E9}$ to $Q_{E11}$ or three MOS transistors $Q_{E12}$ to $Q_{E14}$ is turned on, it is necessary to initially determine a ratio between the series conductance of the three enhancement type MOS transistors and the conductance of the depletion type MOS transistor $Q_{D5}$ to have enough drive to invert the input of the inverter I10.

With $V_O=V_H$ and the MOS transistors $Q_{E15}$ and $Q_{E16}$ both turned on, the input signal Vin3 has no relevancy to the operation of the other input circuits. In other words, both transistors $Q_{E11}$ and $Q_{E14}$ to which gate electrodes the input signal Vin3 is applied are short-circuited by those transistors $Q_{E15}$ and $Q_{E16}$, respectively. In this case, the circuit works as a two-input (Vin1 and Vin2) Exclusive-OR gate logic circuit.

FIG. 23 shows an E/D MOS logic circuit according to another embodiment of this invention, whose logic function can be changed between a NOR gate and a NAND gate This MOS logic circuit includes an Exclusive-OR gate comprising a depletion type MOS transistor $Q_{D6}$ functioning as a load transistor having its source-drain current path connected between one terminal $V_{DD}$ and a node for an output Vout and its gate electrode connected to the node; two enhancement type MOS transistors $Q_{E17}$ and $Q_{E18}$ functioning as driver transistors having their drain-source current paths series-connected between the node for the output Vout and the other terminal $V_{SS}$ and their gate electrodes connected to receive input signals Vin1 and Vin2, respectively, and an enhancement type MOS transistor $Q_{E20}$ having its gate electrode connected to receive the input signal Vin2; and further two enhancement type transistors $Q_{E19}$ and $Q_{E21}$, the drain-source current path of which transistor $Q_{E21}$ being series-connected to the node through the drain-current path of the transistor $Q_{E20}$, the drain-source current path of which transistor $Q_{E19}$ being connected in parallel with that of the transistor $Q_{E18}$, and gate electrodes of which are connected to receive the irreversible control voltage $V_O$. With $V_O=V_L$ in this circuit, the MOS transistors $Q_{E19}$ and $Q_{E21}$ are always turned off. Only when the input signals Vin1 and Vin2 are simultaneously at the H levels, the output Vout becomes an L level via a series circuit of the MOS transistors $Q_{E17}$ and $Q_{E18}$. In this way, the circuit acts as an ordinary NAND gate. With $V_O=V_H$, the MOS transistors $Q_{E19}$ and $Q_{E21}$ are always turned on and ON-OFF operation of the transistor $Q_{E18}$ can give no influence to the output Vout. If one of the input signals Vin1 and Vin2 becomes an H level, the output Vout becomes an L level via a series circuit of the MOS transistors $Q_{E17}$ and $Q_{E19}$ or through a series circuit of the MOS transistors $Q_{E20}$ and $Q_{E21}$. In this way, the circuit works as an ordinary NOR gate. As a consequence, the circuit has two kinds of logic functions, as shown in Truth Table 16, under the control of $V_O$.

TRUTH TABLE 16

|  |  | $V_O=V_H$ Vin1 | | $V_O=V_L$ Vin1 | |
| --- | --- | --- | --- | --- | --- |
|  |  | H | L | H | L |
| Vin2 | H | L | L | L | H |
|  | L | L | H | H | H |
| Kinds of logics | | NOR | | NAND | |

In this way, the MOS logic circuits of the above-mentioned embodiments and modified embodiments have two kinds of logic functions.

As stated above, the MOS logic circuits according to the invention can have two kinds of the logic functions, e.g. NOR or NAND logic determined under the control of the irreversible voltage $V_O$ or $V_O'$ derived from the generator 300 as shown in FIG. 1.

In accordance with the invention, there is an advantage that, first, a MOS logic circuit with no excess redundancy and the predetermined first logic function is prepared and, if it is properly operated as a whole, a proper circuit is completed with no excess redundancy, and secondly if no adequate circuit operation is obtained from the above circuit, the above-mentioned fuse element 2 or 12 of the generator is burned out to permit the irreversible control voltage $V_O$ to vary, causing the first logic function of this circuit to be changed into the second one under the ON/OFF control of the control circuit 200, e.g. the MOS transistor Qn2. In other words, a circuit pattern design modification resulting from a change of the logic function can be avoided by selecting the proper kind of logic functions in irreversible fashion. Furthermore, an adequate design for the MOS logic circuit can be made by eliminating the extra redundancy.

Consequently, according to the above-mentioned embodiments, since the MOS logic circuits hold such redundancy functions that the logic functions thereof can be changed by way of the irreversible control voltage from the generator, it is possible to provide the MOS logic circuit with simpler design or without extra redundancies; a design modification on the logic functions for the circuits; an improper signal propagation speed; or an excess signal propagation time.

Next, a MOS logic circuit belonging to the aforementioned second category will be explained below in connection with the following preferred embodiments. Namely, setting the voltage level of the irreversible control voltage enables the transfer characteristics between the input signal and the output signal to be changed with the logic function of the entire MOS circuit unchanged.

It should be understood in this specification that the definition of input/output signal transfer characteristics includes:

a ratio of the rise time delay to the fall time delay on the output voltage and the input voltage; and a signal transfer speed from the input to the output, and an input inversion voltage defined as the input voltage where the output voltage shifts to be the center voltage between two voltages of the power supply, i.e., from one stable voltage to the other one.

FIGS. 24 through 37 show MOS logic circuits according to the preferred embodiments of this invention in which the known logic circuit essentially consisting of a C-MOS structure is utilized.

FIGS. 24A, 24B, 24C and 24D show the circuit diagram, equivalent circuit diagrams and signal transfer characteristic curves, respectively, of the embodiment of this invention in which a known C-MOS inverter is utilized.

In the MOS logic circuit as shown in FIG. 24A, C-MOS transistor inverters Qp51 and Qn51 have their source-drain current paths connected in series between one terminal $V_{DD}$ and the other terminal $V_{SS}$, with the common connection point forming a node for the output terminal Vout, and their gate electrodes connected together to receive an input signal Vin, Two p-channel MOS transistors Qp52 and Qp53 have their source-drain current paths connected in series between the one terminal $V_{DD}$ and the node, the gate electrode of which MOS transistor Qp53 is connected also to receive the input terminal Vin and, to the gate electrode of which MOS transistor Qp52 is connected to receive the irreversible control voltage $V_O$ derived from the generator 300, e.g. the generator in FIG. 2.

It is assumed in this specification that the beta of the above-mentioned MOS transistors Qp51, Qp52, Qp53 and Qn51 are $\beta p1$, $\beta p2$, $\beta p3$ and $\beta n1$, respectively.

The "beta", i.e., the gain coefficient of transconductance of a MOS transistor should be defined as a constant that can be determined by the thickness and permittivity of a gate insulating layer, mobility of carriers, channel length and channel width (consequently $\beta > 1$).

When $V_O=V_H$ (the voltage on the terminal $V_{DD}$) in the circuit as shown in FIG. 24A, the MOS transistor Qp52 is turned off and, in this case the two MOS transistors Qp52 and Qp53 are irrelevant to the operation of the input circuits Qp51 and Qn51. An equivalent circuit at this time is as shown in FIG. 24B and the drivability at the p-channel side corresponds to $\beta p1$ of the MOS transistor Qp51 per se and the drivability at the n-channel side corresponds to $\beta n1$ of the MOS transistor Qn51 per se. When, on the other hand, $V_O=V_L$ (the voltage on the terminal $V_{SS}$), the MOS transistor Qp52 is always turned on. With Vin at the L level, the MOS transistor Qp53 is rendered in the ON state. At this time, two current paths from the supply terminal $V_{DD}$ to the output terminal Vout are established, one including the MOS transistor Qp51 and the other including the series arrangement of MOS transistors Qp52 and Qp53. In this case, an equivalent circuit serves as an inverter, as shown in FIG. 24C, constituted by a p-channel MOS transistor Qpa having the synthesized beta of $$\beta p1 + \frac{\beta p2 \cdot \beta p3}{\beta p2 + \beta p3}$$

and an n-channel MOS transistor Qn51 having the beta of $\beta n1$. With $V_O = V_L$, it is possible to obtain the equivalent C-MOS inverter in which the beta at the p-channel side can be increased effectively $$1 + \frac{\beta p2 \cdot \beta p3}{\beta p1(\beta p2 + \beta p3)}$$

times more than that beta in the case of $V_O = V_H$, i.e., $\beta p1$.

Consequently, when $V_O = V_L$, the rise time delay (i.e. the time delay of the rising slope of an output signal waveform upon receipt of a falling input signal waveform) can be shortened to be approximately $$\left(1 + \frac{\beta p2 \cdot \beta p3}{\beta p1(\beta p2 + \beta p3)}\right)^{-1}$$

times than that at $V_O = V_H$. Furthermore, the input inversion voltage is closer to $V_{DD}$ than that when $V_O = V_H$. The input inversion voltage means an input voltage of the inverter when the output voltage of the inverter becomes $\frac{1}{2}(V_{DD} + V_{SS})$ so as to invert the inverter output voltage. FIG. 25D shows an input/output signal characteristic curve at $V_O = V_H$ and $V_O = V_L$ in this embodiment.

Figure 25C:
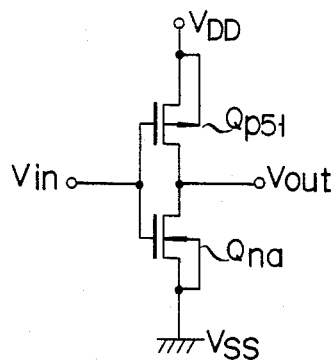
Figure 25D:
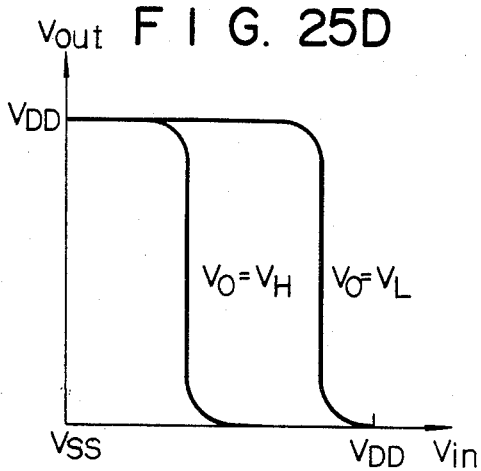

FIG 25A shows a C-MOS logic circuit according to another embodiment of this invention in which a C-MOS inverter is used. FIGS. 25B, 25C and 25D show equivalent circuits and characteristic curves, respectively. Although in the embodiment as shown in FIG. 24A the MOS transistor is provided at the p-channel side to receive the irreversible control voltage $V_O$ as a gate input signal, the embodiment as shown in FIG. 25A is such that the source-drain current paths of two n-channel MOS transistors Qn52 and Qn53 are connected in series between a terminal $V_{SS}$ and the node for the output Vout with transistor Qn53 nearer $V_{SS}$ and transistor Qn52 nearer the node for Vout, the output voltage $V_O$ of the generator 300 shown in FIG. 1 is applied to the gate of the MOS transistor Qn53 and an input signal Vin is applied to the gate of the MOS transistor Qn52. The MOS transistors Qn52 and Qn53 take the beta of $\beta n2$ and $\beta n3$, respectively. With $V_O = V_L$ in this circuit the MOS transistor Qn53 is turned off and thus the two MOS transistors Qn52 and Qn53 become independent of the operation of the input circuits Qp51 and Qn51. At this time, the equivalent circuit is as shown in FIG. 25B and the drivability of the p-channel side corresponds to $\beta p1$ of the MOS transistor Qp51 per se and the drivability of the n-channel side to $\beta n1$ of the MOS transistor Qn51 per se.

With $V_O = V_H$ the MOS transistor Qn53 is always at the ON state and with Vin at the "H" level the MOS transistor Qn52 assumes the ON state. At this time, two current paths from Vout to $V_{SS}$ are established: one through the MOS transistor Qn51 and the other through the MOS transistors Qn52 and Qn53. In this case, the equivalent circuit is an inverter, as shown in FIG. 25C, in which an n-channel MOS transistor Qna has a value of $$\beta n1 + \frac{\beta n2 \cdot \beta n3}{\beta n2 + \beta n3}$$

and the p-channel MOS transistor Qp51 has a value of $\beta p1$. Accordingly, with $V_O = V_H$ it is possible to obtain such an equivalent C-MOS inverter that beta of the n-channel side thereof can be increased effectively $$1 + \frac{\beta n2 \cdot \beta n3}{\beta n1(\beta n2 + \beta n3)}$$

times more than that beta when at $V_O = V_L$. In other words, in case of $V_O = V_H$ the fall time delay of Vout will be shortened to be approximately $$\left(1 + \frac{\beta n2 \cdot \beta n3}{\beta n1(\beta n2 + \beta n3)}\right)^{-1}$$

times than that at $V_O = V_L$. FIG. 25D shows an input/output signal transfer characteristic at $V_O = V_H$ and $V_O = V_L$ in this circuit.

Figure 26A:
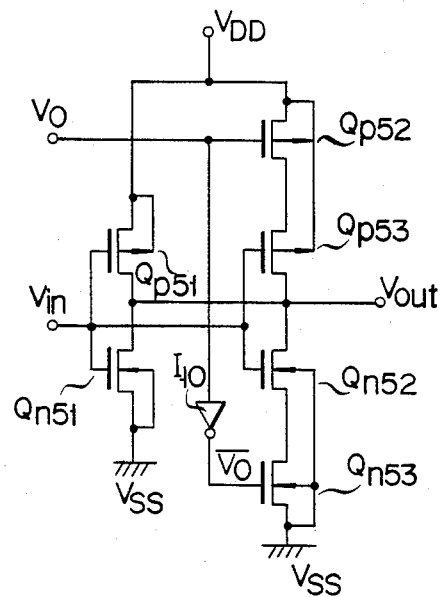
Figure 26B:
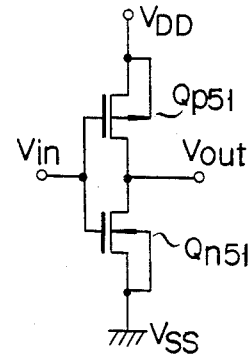
Figure 26C:
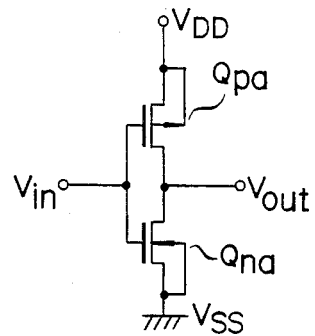

FIG. 26A shows a MOS logic circuit according to another embodiment of this invention, in which a C-MOS inverter is used, FIGS. 26B and 26C being the corresponding equivalent circuits. Although in the embodiments as shown in FIGS. 24A and 25A the MOS transistor adapted to receive $V_O$ as a gate input signal has been provided in either the p-channel side or the n-channel side, this embodiment is such that p-channel MOS transistors Qp52 and Qp53 and n-channel MOS transistors Qn52 and Qn53 are connected as shown in FIG. 26A in which the irreversible voltage $V_O$ is applied directly to the gate electrode of the MOS transistor Qp52 and through a C-MOS inverter I10 to the gate electrode of the MOS transistor Qn53 and an input signal Vin is supplied to the gate electrodes of the MOS transistors Qp53 and Qn52. In the circuit as shown in FIG. 26A, when $V_O = V_H$ the MOS transistors Qp52 and Qn53 are turned off, so that the MOS transistors Qp52, Qp53, Qn52 and Qn53 become independent from the operation of input circuits Qp51 and Qn51. At this time, the equivalent circuit becomes an ordinary C-MOS inverter, as shown in FIG. 26B, comprising only MOS transistors Qp51 and Qn51. With $V_O = V_L$ the MOS transistors Qp52 and Qn53 are always in the ON state. In this case, the equivalent circuit is an inverter comprising a p-channel MOS transistor Qpa having the composed beta of $$\beta p1 + \frac{\beta p2 \cdot \beta p3}{\beta p2 + \beta p3}$$

and an n-channel MOS transistor Qna having a composed beta of $$\beta n1 + \frac{\beta n2 \cdot \beta n3}{\beta n2 + \beta n3}.$$

FIG. 27A is a circuit diagram showing a C-MOS logic circuit according to another embodiment of this invention, in which an ordinary C-MOS inverter is used, FIGS. 27B to 27E being the corresponding equivalent circuits. In this embodiment, two kinds of voltages $V_{O1}$ and $V_{O2}$ from the irreversible control voltage generator 300 in FIG. 1 are prepared, permitting four kinds of effective drivability at the p-channel side. The circuit as shown in FIG. 27A includes the ordinary C-MOS inverter comprising a p-channel MOS transistor Qp51 and n-channel MOS transistor Qn51. In this circuit, the source-drain current paths of p-channel MOS transistors Qp54 and Qp55 are connected in series between an output signal Vout and a terminal $V_{DD}$ and p-channel MOS transistors Qp56 and Qp57 are connected in parallel with the MOS transistors Qp54 and Qp55. The voltage $V_{O1}$ is applied to the gate electrode of the MOS transistor Qp54, the voltage $V_{O2}$ is applied to the gate electrode of the MOS transistor Qp56 in the $V_{DD}$ side, and an input signal Vin is applied to the gate electrodes of the MOS transistors Qp55 and Qp57. The MOS transistors Qp54 to Qp57 correspond to the beta of $\beta p4$ to $\beta p7$, respectively. With $V_{O1}=V_{O2}=V_H$, the MOS transistors Qp54 and Qp56 are turned off and the MOS transistors Qp54 to Qp57 become independent of the operation of the input circuit. At this time, the equivalent circuit becomes an ordinary C-MOS inverter, as shown in FIG. 27B, comprising the MOS transistors Qp51 and Qn51. With $V_{O1}=V_L$ and $V_{O2}=V_H$, the equivalent circuit is as shown in FIG. 27C and at this time the beta of the MOS transistor Qpb at the p-channel side becomes $$\beta p1 + \frac{\beta p4 \cdot \beta p5}{\beta p4 + \beta p5}.$$

With $V_{O1}=V_H$ and $V_{O2}=V_L$ the equivalent circuit is as shown in FIG. 27D and at this time the beta of the MOS transistor Qpc at the p-channel side becomes $$\beta p1 + \frac{\beta p6 \cdot \beta p7}{\beta p6 + \beta p7}.$$

With $V_{O1}=V_{O2}=V_L$, the equivalent circuit is as shown in FIG. 27E and at this time the beta of the MOS transistor Qpd at the p-channel side is given by $$\beta p1 + \frac{\beta p4 \cdot \beta p5}{\beta p4 + \beta p5} + \frac{\beta p6 \cdot \beta p7}{\beta p6 + \beta p7}$$

FIG. 28A is a MOS logic circuit according to another embodiment of this invention, in which a delay circuit of a two-stage inverter structure is used, FIGS. 28B and 28C being the corresponding equivalent circuits. The MOS logic circuit as shown in FIG. 28A includes a delay circuit comprising a first stage C-MOS inverter I20 constituted by a p-channel MOS transistor Qp58 having its source-drain current path connected between one terminal $V_{DD}$ and a node N5 and its gate electrode connected to the other terminal $V_{SS}$ and an n-channel MOS transistor Qn54 having a drain-source current path connected between the node N5 and the terminal $V_{SS}$ and its gate electrode connected to receive an input signal, Vin; and a second stage C-MOS inverter I30 constituted by a p-channel MOS transistor Qp59 having its source-drain current path connected between the terminal $V_{DD}$ and an output Vout and its gate electrode connected to receive a signal on the node N5 and an n-channel MOS transistor Qn55 having its drain-source current path connected between the output Vout and the terminal $V_{SS}$ and its gate electrode connected to receive the signal on the node N5. It should be noted that since the gate electrode of the transistor Qp58 of the first stage C-MOS inverter I20 is directly connected to the supply terminal $V_{SS}$, it works as the load transistor, and precisely speaking, although it is not called a "C-MOS inverter", practically it is preferable to call it so in this specification. In this MOS logic circuit, a p-channel MOS transistor Qp60 has its source-drain current path between the terminal $V_{DD}$ and the node N5 has its gate and connected to receive as a gate input signal (the irreversible control voltage) $V_O$ from the generator 300 in FIG. 1. It would be supposed that the MOS transistors Qn54, Qp58 and Qp60 have the beta of $\beta n4$, $\beta p8$ and $\beta p10$, respectively, and that the rise time delay and fall time delay of the C-MOS inverters I20 and I30 when the input signal Vin falls are represented by $\tau 2$ and $\tau 3$, respectively. When $V_O=V_H$, the MOS transistor Qp60 is turned off. At this time, the equivalent circuit is as shown in FIG. 28B and an entire fall time delay $\tau f$ is given by a sum of $\tau 2+\tau 3$. When at $V_O=V_L$ the MOS transistor Qp60 is turned on, the p-channel side of the C-MOS inverter I20 is represented by a MOS transistor Qpe having a composed value of $\beta p8$ and $\beta p10$, as indicated by the equivalent circuit of FIG. 28C. As a result, the signal delay time of the first stage C-MOS inverter 20 will be shortened to be approximately $$\left( \frac{\beta p8}{\beta p8 + \beta p10} \right)$$

times than that at $V_O=V_H$ and thus an entire fall time delay $\tau f$ corresponds to approximately $$\left( \frac{\beta p8}{\beta p8 + \beta p10} \right) \cdot \tau 2 + \tau 3.$$

It is to be noted here that, even if $\beta n4 > \beta p8 + \beta p10$ and the transistor Qp60 is turned on, the transistor Qn54 has enough drive to cause the output Vout of the inverter I30 to be changed to the $V_{DD}$ side.

FIG. 29A shows a MOS logic circuit according to another embodiment of this invention, in which a delay circuit of a two-stage inverter structure is utilized, FIGS. 29B and 29C being the corresponding equivalent circuits. Although in the embodiment of FIG. 28A the MOS transistor Qp60 connected to receive $V_O$ as the gate input signal is provided at the p-channel side, the MOS logic circuit as shown in FIG. 29A is such that an n-channel MOS transistor Qn56 has its drain-source current path connected between the node N5 and the terminal $V_{SS}$ and connected to receive $V_O$ as a gate input signal.

In order to transfer the input rising signal with a delay in this embodiment, an input signal Vin is applied to the gate electrode of a p-channel MOS transistor Qp58 in a first stage C-MOS inverter I22 and the gate of an n-channel MOS transistor Qn54 is connected to a terminal $V_{DD}$. It is assumed that the MOS transistors Qp58, Qn54 and Qn56 have the values of $\beta p8$, $\beta n4$ and $\beta n6$, respectively, and that the fall time delay and rise time delay of the C-MOS inverters I22 and I30 when the input signal Vin rises are represented by $\tau 2'$ and $\tau 3'$, respectively. When $V_O=V_L$, the MOS transistor Qn56 is turned off. At this time, the equivalent circuit is as shown in FIG. 29B and an entire rise time delay $\tau r$ corresponds to a sum of $\tau 2'$ and $\tau 3'$. With $V_O = V_H$, the MOS transistor Qn56 is turned on and the n-channel side of the C-MOS inverter I22 is represented by a MOS transistor Qnb having a composed beta of $\beta n4 + \beta n6$ as indicated by the equivalent circuit of FIG. 29C and a signal time delay in the first stage C-MOS inverter I22 will be shortened to $$\frac{\beta n4}{\beta n4 + \beta n6}.$$

As a result, an entire rise time delay $\tau r$ will be given by $$\left(\frac{\beta n4}{\beta n4 + \beta n6}\right) \cdot \tau 2' + \tau 3'$$

It is to be noted here that even if $\beta p8 > \beta n4 + \beta n6$ and the MOS transistor Qn6 is turned on, the MOS transistor Qp8 has enough drive to cause the output Vout of an inverter I3 to be changed to the $V_{SS}$ side.

The following is an explanation of MOS logic circuits utilizing a logic circuit having two or more inputs.

Figure 30:
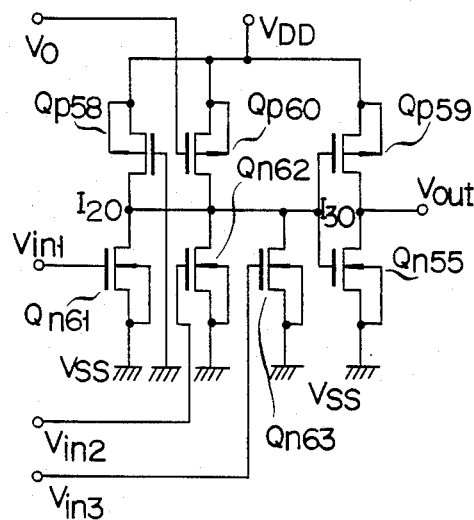
FIG. 30 shows a circuit diagram of another embodiment belonging to the second category, in which a multiple input C-MOS OR gate delay circuit is utilized.

FIG. 30 shows a MOS logic circuit including a multi-input OR type delay circuit obtained by modifying the first stage inverter of the embodiment of FIG. 28A into a multi-input version, in which input signals Vin1, Vin2 and Vin3 are applied to the gates of n-channel MOS transistors Qn61, Qn62 and Qn63, respectively.

Figure 31:
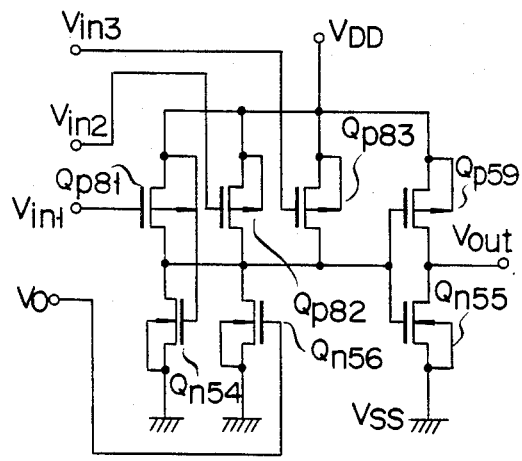
FIG. 31 shows a circuit diagram of another embodiment belonging to the second category, in which a multiple input C-MOS AND gate delay circuit is used.

FIG. 31 shows a MOS logic circuit including an AND type delay circuit obtained by modifying the first stage inverter of the embodiment of FIG. 29A into a multi-input version, in which input signals Vin1, Vin2 and Vin3 are applied to the gate electrodes of p-channel MOS transistors Qp81, Qp82 and Qp83, respectively.

When in the embodiment shown in FIG. 30 or FIG. 31 a MOS transistor Qp60 or Qn56 is turned on, the fall time delay or the rise time delay thereof will be made shorter than when the MOS transistor Qp60 or Qn56 is turned off.

Figure 32:
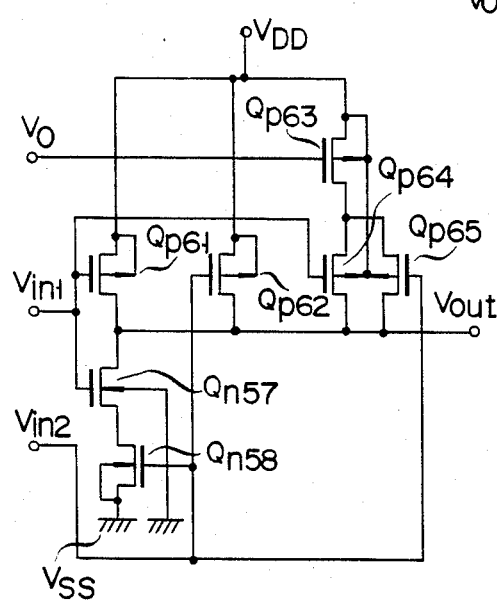
FIGS. 32 through 34 each show a circuit diagram of another embodiment belonging to the second category, in which a two-input C-MOS NAND gate is utilized.
Figure 33:
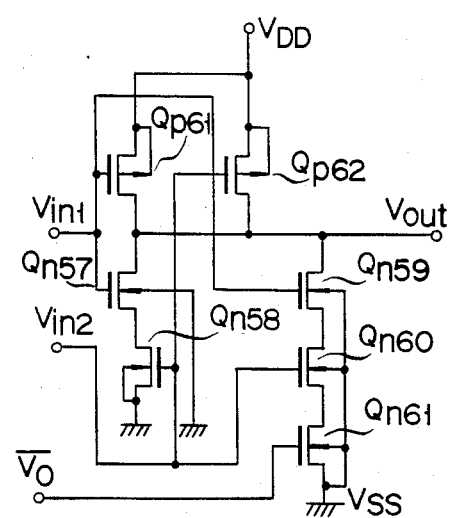
Figure 34:
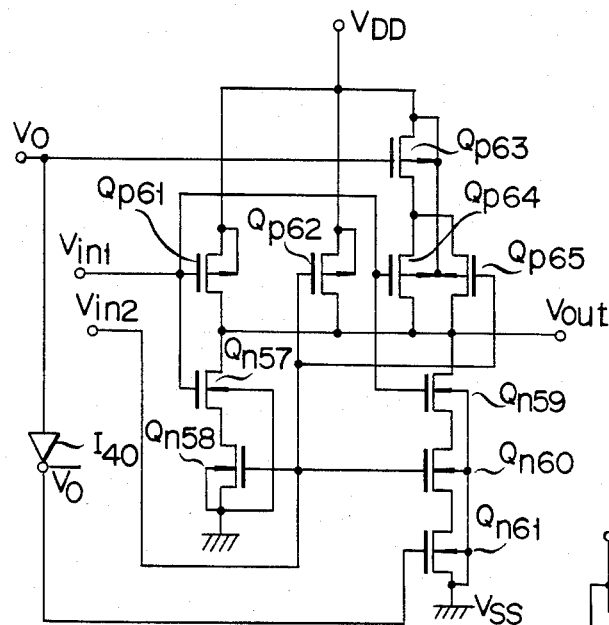

FIGS. 32 to 34 show MOS logic circuits according to the embodiments of this invention, in which an ordinary two-input C-MOS NAND circuit is utilized.

The MOS logic circuit of FIG. 32 includes the ordinary two-input C-MOS NAND gate comprising p-channel MOS transistors Qp61 and Qp62 having their source-drain current paths connected in parallel between one terminal $V_{DD}$ and the node for the output Vout and connected to receive input signals Vin1 and Vin2 as gate input signals, respectively, and n-channel MOS transistors Qn57 and Qn58 having their drain-source current paths connected in series between the output Vout and a terminal $V_{SS}$ and connected to receive the input signals Vin1 and Vin2 as gate input signals, and further p-channel MOS transistors Qp63 and Qp64 having their source-drain current paths connected in series between the one terminal $V_{DD}$ and the node for the output Vout and a p-channel MOS transistor Qp65 having its source-drain current path connected between the drain of the MOS transistor Qp63 and the output Vout. The irreversible control voltage $V_O$ is applied to the gate of the MOS transistor Qp63 as a gate input signal and the input signals Vin1 and Vin2 are applied to the gate electrodes of the MOS transistors Qp64 and Qp65.

The MOS logic circuit as shown in FIG. 33 includes an ordinary two-input C-MOS NAND gate comprising MOS transistors Qp61, Qp62, Qn57 and Qn58 connected as shown in FIG. 32, and further includes n-channel MOS transistors Qn59, Qn60 and Qn61 having their drain-source current paths connected in series between the output Vout and a terminal $V_{SS}$, input signals Vin1 and Vin2 being applied to the gate electrodes of which MOS transistors Qn59 and Qn60, respectively, and a voltage $\overline{V_O}$ having an opposite relation to $V_O$ being applied to the gate of the MOS transistor Qn61.

In the MOS logic circuit of FIG. 34, MOS transistors Qp63, Qp64, Qp65 and Qn59, Qn60, Qn61 are all added to an ordinary two-input C-MOS NAND circuit and a C-MOS inverter I40 is added to obtain the inverted voltage $\overline{V_O}$.

If in the embodiments as shown in FIGS. 32 to 34 the beta of the MOS transistors Qp61 to Qp65 are represented by $\beta p11$ to $\beta p15$, respectively, and the beta of the MOS transistors Qn57 to Qn61 by $\beta n7$ to $\beta n11$, respectively, then the effective beta $\beta p$ at the p-channel side of Vout and the effective beta $\beta n$ at the n-channel side thereof with respect to Vin1, Vin2 and $V_O$ or $\overline{V_O}$ will be as indicated by the following Tables 17 to 19.

TABLE 17

| (C-MOS NAND gate shown in FIG. 32) | | |
|---|---|---|
| $V_O = V_H$ | Vin1 = L | $\beta p = \beta p11$ |
| $(\overline{V_O} = V_L)$ | Vin2 = H | |
| | Vin1 = H | $\beta p = \beta p12$ |
| | Vin2 = L | |
| | Vin1 = L | $\beta p = \beta p11 + \beta p12$ |
| | Vin2 = L | |
| | Vin1 = H | $\beta n \simeq \dfrac{\beta n7 \cdot \beta n8}{\beta n7 + \beta n8}$ |
| | Vin2 = H | |
| $V_O = V_L$ | Vin1 = L | $\beta p \simeq \beta p11 + \dfrac{\beta p13 \cdot \beta p14}{\beta p13 + \beta p14}$ |
| $(\overline{V_O} = V_H)$ | Vin2 = H | |
| | Vin1 = H | $\beta p \simeq \beta p12 + \dfrac{\beta p13 \cdot \beta p15}{\beta p13 + \beta p15}$ |
| | Vin2 = L | |
| | Vin1 = L | $\beta p \simeq \beta p11 + \beta p12 +$ |
| | Vin2 = L | $\dfrac{\beta p13(\beta p14 + \beta p15)}{\beta p13 + \beta p14 + \beta p15}$ |
| | Vin1 = H | $\beta n \simeq \dfrac{\beta n7 \cdot \beta n8}{\beta n7 + \beta n8}$ |
| | Vin2 = H | |

TABLE 18

| (C-MOS NAND gate shown in FIG. 33) | | |
|---|---|---|
| $V_O = V_H$ | Vin1 = L | $\beta p = \beta p11$ |
| $(\overline{V_O} = V_L)$ | Vin2 = H | |
| | Vin1 = H | $\beta p = \beta p12$ |
| | Vin2 = L | |
| | Vin1 = L | $\beta p = \beta p11 + \beta p12$ |
| | Vin2 = L | |
| | Vin1 = H | $\beta n \simeq \dfrac{\beta n7 \cdot \beta n8}{\beta n7 + \beta n8}$ |
| | Vin2 = H | |
| $V_O = V_L$ | Vin1 = L | $\beta p = \beta p11$ |
| $(\overline{V_O} = V_H)$ | Vin2 = H | |
| | Vin1 = H | $\beta p = \beta p12$ |
| | Vin2 = L | |
| | Vin1 = L | $\beta p = \beta p11 + \beta p12$ |
| | Vin2 = L | |

TABLE 18-continued (C-MOS NAND gate shown in FIG. 33)

| | |
|---|---|
| Vin1 = H<br>Vin2 = H | $\beta n \simeq \dfrac{\beta n7 \cdot \beta n8}{\beta n7 + \beta n8} + \dfrac{1}{\dfrac{1}{\beta n9} + \dfrac{1}{\beta n10} + \dfrac{1}{\beta n11}}$ |

TABLE 19

(C-MOS NAND gate shown in FIG. 34)

| | | |
|---|---|---|
| $V_O = V_H$<br>($\overline{V_O} = V_L$) | Vin1 = L<br>Vin2 = H | $\beta p = \beta p11$ |
| | Vin1 = H<br>Vin2 = L | $\beta p = \beta p12$ |
| | Vin1 = L<br>Vin2 = L | $\beta p = \beta p11 + \beta p12$ |
| | Vin1 = H<br>Vin2 = H | $\beta n \simeq \dfrac{\beta n7 \cdot \beta n8}{\beta n7 + \beta n8}$ |
| $V_O = V_L$<br>($\overline{V_O} = V_H$) | Vin1 = L<br>Vin2 = H | $\beta p \simeq \beta p11 + \dfrac{\beta p13 \cdot \beta p14}{\beta p13 + \beta p14}$ |
| | Vin1 = H<br>Vin2 = L | $\beta p \simeq \beta p12 + \dfrac{\beta p13 \cdot \beta p15}{\beta p13 + \beta p15}$ |
| | Vin1 = L<br>Vin2 = L | $\beta p \simeq \beta p11 + \beta p12 + \dfrac{\beta p13(\beta p14 + \beta p15)}{\beta p13 + \beta p14 + \beta p15}$ |
| | Vin1 = H<br>Vin2 = H | $\beta n \simeq \dfrac{\beta n7 \cdot \beta n8}{\beta n7 + \beta n8} + \dfrac{1}{\dfrac{1}{\beta n9} + \dfrac{1}{\beta n10} + \dfrac{1}{\beta n11}}$ |

Figure 35:
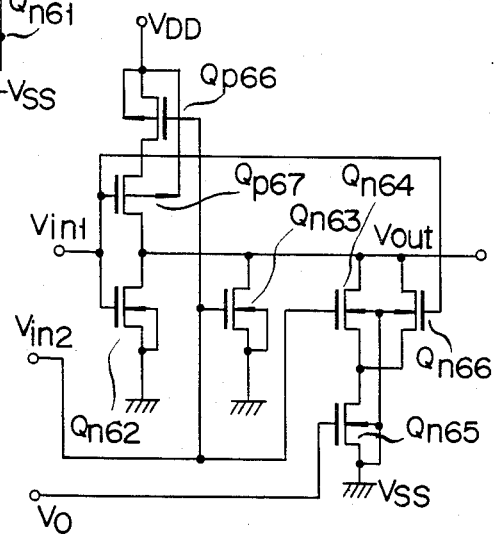
Figure 36:
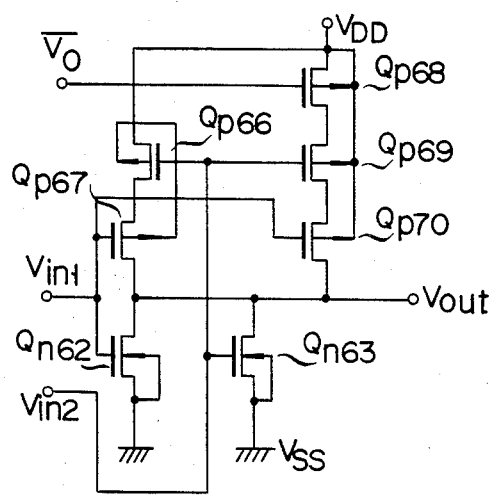

FIGS. 35 to 37 show MOS logic circuits according to the embodiments of this invention, in which an ordinary two-input C-MOS NOR gate is utilized.

The MOS logic circuit of FIG. 35 includes the ordinary two-input C-MOS NOR gate constituted by p-channel MOS transistors Qp66 and Qp67 having their source-drain current paths connected in series between one terminal $V_{DD}$ and the node for the output Vout and their gate electrodes connected to receive input signals Vin2 and Vin1 as gate input signals respectively; and n-channel MOS transistors Qn62 and Qn63 connected in parallel between the output Vout and a terminal $V_{SS}$ and connected to receive the input signals Vin1 and Vin2 as gate input signals, respectively; and further n-channel MOS transistors Qn64 and Qn65 having their drain-source current paths connected in series between the output Vout and the terminal $V_{SS}$, an n-channel MOS transistor Qn66 having its source-drain current path connected in parallel to the MOS transistor Qn64 between the output Vout and the MOS transistor Qn65, the input signals Vin2 and Vin1 being applied to the gates of the MOS transistors Qn64 and Qn66, respectively, and $V_O$ being applied to the gate electrode of the MOS transistor Qn65.

The MOS logic circuit as shown in FIG. 36 includes an ordinary two-input C-MOS NOR circuit constituted by MOS transistors Qp66, Qp67, Qn62 and Qn63 as discussed above, and further p-channel MOS transistors Qp68, Qp69 and Qp70 having their source-drain current paths connected in series between a terminal $V_{DD}$ and an output Vout, $V_O$ having an opposite relation to $V_O$ being applied to the gate electrode of the MOS transistor Qp68 and input signals Vin2 and Vin1 being applied to the gate electrodes of the MOS transistors Qp69 and Qp70, respectively.

In the MOS logic circuit as shown in FIG. 37, MOS transistors Qn64, Qn65, Qp68, Qp69 and Qp70 are added to an ordinary two-input C-MOS NOR gate as modified in FIG. 36, and a C-MOS inverter I50 is added to the circuit to obtain $V_O$.

If in the embodiments of FIGS. 35 to 37 the MOS transistors Qp66 to Qp70 have the beta of $\beta p16$ to $\beta p20$, respectively, and the MOS transistors Qn62 to Qn66 the beta of $\beta n12$ to $\beta n16$, respectively, then an effective beta $\beta p$ at the p-channel side of Vout and effective beta $\beta n$ at the n-channel side thereof with respect to Vin1, Vin2 and $V_O$ or $\overline{V_O}$ will be as indicated by the following Tables 20 to 22.

TABLE 20

(C-MOS NOR gate shown in FIG. 35)

| | | |
|---|---|---|
| $V_O = V_L$<br>($\overline{V_O} = V_H$) | Vin1 = H<br>Vin2 = L | $\beta n = \beta n12$ |
| | Vin1 = L<br>Vin2 = H | $\beta n = \beta n13$ |
| | Vin1 = H<br>Vin2 = H | $\beta n = \beta n12 + \beta n13$ |
| | Vin1 = L<br>Vin2 = L | $\beta p = \dfrac{\beta p16 \cdot \beta p17}{\beta p16 + \beta p17}$ |
| $V_O = V_H$<br>($\overline{V_O} = V_L$) | Vin1 = H<br>Vin2 = L | $\beta n \simeq \beta n12 + \dfrac{\beta n15 \cdot \beta n16}{\beta n15 + \beta n16}$ |
| | Vin1 = L<br>Vin2 = H | $\beta n \simeq \beta n13 + \dfrac{\beta n14 \cdot \beta n15}{\beta n14 + \beta n15}$ |
| | Vin1 = H<br>Vin2 = H | $\beta n \simeq \beta n12 + \beta n13 + \dfrac{\beta n15(\beta n14 + \beta n16)}{\beta n14 + \beta n15 + \beta n16}$ |
| | Vin1 = L<br>Vin2 = L | $\beta \simeq \dfrac{\beta p16 \cdot \beta p17}{\beta p16 + \beta p17}$ |

TABLE 21

(C-MOS NOR gate shown in FIG. 36)

| | | |
|---|---|---|
| $V_O = V_L$<br>($\overline{V_O} = V_H$) | Vin1 = H<br>Vin2 = L | $\beta n = \beta n12$ |
| | Vin1 = L<br>Vin2 = H | $\beta n = \beta n13$ |
| | Vin1 = H<br>Vin2 = H | $\beta n = \beta n12 + \beta n13$ |
| | Vin1 = L<br>Vin2 = L | $\beta p \simeq \dfrac{\beta p16 \cdot \beta p17}{\beta p16 + \beta p17}$ |
| $V_O = V_H$<br>($\overline{V_O} = V_L$) | Vin1 = H<br>Vin2 = L | $\beta n = \beta n12$ |
| | Vin1 = L<br>Vin2 = H | $\beta n = \beta n13$ |
| | Vin1 = H<br>Vin2 = H | $\beta n = \beta n12 + \beta n13$ |
| | Vin1 = L<br>Vin2 = L | $\beta p \simeq \dfrac{\beta p16 \cdot \beta p17}{\beta p16 + \beta p17} + \dfrac{1}{\dfrac{1}{\beta p18} + \dfrac{1}{\beta p19} + \dfrac{1}{\beta p20}}$ |

TABLE 22

(C-MOS NOR gate shown in FIG. 37)

| | | |
|---|---|---|
| $V_O = V_L$<br>($\overline{V_O} = V_H$) | Vin1 = H<br>Vin2 = L | $\beta n = \beta n12$ |
| | Vin1 = L<br>Vin2 = H | $\beta n = \beta n13$ |
| | Vin1 = H<br>Vin2 = H | $\beta n = \beta n12 + \beta n13$ |

TABLE 22-continued (C-MOS NOR gate shown in FIG. 37)

| | | |
|---|---|---|
| | Vin2 = H | |
| | Vin1 = L<br>Vin2 = L | $\beta p \simeq \dfrac{\beta p16 \cdot \beta p17}{\beta p16 + \beta p17}$ |
| $V_O = V_H$<br>$(\overline{V}_O = V_L)$ | Vin1 = H<br>Vin2 = L | $\beta n \simeq \beta n12 + \dfrac{\beta n15 \cdot \beta n16}{\beta n15 + \beta n16}$ |
| | Vin1 = L<br>Vin2 = H | $\beta n \simeq \beta n13 + \dfrac{\beta n14 \cdot \beta n15}{\beta n14 + \beta n15}$ |
| | Vin1 = H<br>Vin2 = H | $\beta n \simeq \beta n12 + \beta n13 + \dfrac{\beta n15(\beta n14 + \beta n16)}{\beta n14 + \beta n15 + \beta n16}$ |
| | Vin1 = L<br>Vin2 = L | $\beta p \simeq \dfrac{\beta p16 \cdot \beta p17}{\beta p16 + \beta p17} + \dfrac{1}{\dfrac{1}{\beta p18} + \dfrac{1}{\beta p19} + \dfrac{1}{\beta p20}}$ |

FIG. 38 shows a MOS logic circuit according to another embodiment of this invention, in which an ordinary three-input C-MOS Exclusive-OR type delay circuit is utilized. The MOS logic circuit includes firstly an ordinary delay type three-input C-MOS Exclusive-OR gate comprising a p-channel MOS transistor Qp71 having its source-drain current path connected between one terminal $V_{DD}$ and a node N6 and its gate electrode connected to the other terminal $V_{SS}$ and functioning as a load transistor, secondly n-channel MOS transistors Qn67, Qn68 and Qn69 functioning as driver transistors having their drain-source current paths connected in series between the node N6 and the other terminal $V_{SS}$ and their gate electrodes connected to receive input signals Vin1, Vin2 and Vin3 as gate input signals, respectively, thirdly n-channel MOS transistors Qn70, Qn71 and Qn72 functioning as driver transistors having their drain-source current paths connected in series between the node N6 and the other terminal $V_{SS}$ and their gate electrodes connected to receive the input signals Vin1, Vin2 and Vin3, respectively, through C-MOS inverters I60, I70 and I80, fourthly a C-MOS inverter I90 adapting to invert a signal on the node N6 to obtain an output Vout, and finally a p-channel MOS transistor Qp72 having its source-drain current path connected between one terminal $V_{DD}$ and the node N6 and its gate electrode connected to receive the voltage $V_O$ as a gate input signal which is the reversed voltage.

In this embodiment, the beta (=drive) of the load transistor Qp71 with respect to the node N6 can be varied by varying $V_O$ and thus the time delay can be varied. That is, with $V_O=V_H$ the MOS transistor Qp72 is turned off and the load capability of the p-channel side becomes relatively small and thus the fall time delay of Vout becomes longer. With $V_O=V_L$, on the other hand, the MOS transistor Qp72 is turned on and the load capability of the p-channel side becomes relatively great and thus the fall time delay of Vout becomes smaller. Needless to say even if the MOS transistor Qp72 is turned on, the series-connected n-channel MOS transistors Qn67 and Qn69 to Qn72 have enough drive to change the output of the inverter to the $V_{DD}$ side.

Having explained the invention in connection with the C-MOS structures, the following description of the invention explain the embodiments as shown in FIGS. 39 through 48 which employ Enhancement/Depletion mode structures with a depletion mode MOS transistor as a load transistor and an enhancement mode MOS transistor as a driver transistor.

Figure 39C:
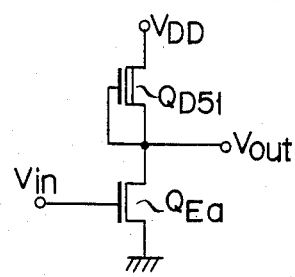
FIGS. 39 through 43 show circuit diagrams, equivalent circuit diagrams and transfer characteristic curves of further embodiments, belonging to the second category, in which the known enhancement/depletion type MOS logic circuit is utilized.
Figure 39D:
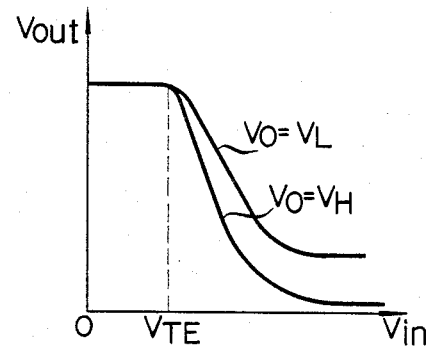

FIG. 39A shows a MOS logic circuit according to the embodiment of this invention in which an ordinary E/D type inverter is utilized, FIGS. 39B, 39C and 39D showing the corresponding equivalent circuits and transfer characteristic curves. This MOS logic circuit includes the E/D type inverter comprising a depletion type MOS transistor $Q_{D51}$ functioning as a load transistor having its source-drain current path connected between one terminal $V_{DD}$ and a node for an output Vout and its gate electrode connected to the node and an enhancement type MOS transistor $Q_{E51}$ functioning as a driver transistor having its drain-source current path connected between the other terminal $V_{SS}$ and the node for the output Vout and its gate electrode connected to receive an input signal Vin, and further, enhancement type MOS transistors $Q_{E52}$ and $Q_{E53}$ having their drain-source current paths connected in series between the node for the output Vout and the other terminal $V_{SS}$ with transistor $Q_{E52}$ nearer the node for Vout and transistor $Q_{E53}$ nearer the node for $V_{SS}$, the input signal Vin being applied to the gate electrode of the MOS transistor $Q_{E52}$ and the irreversible control voltage $V_O$ from the generator 300 or the generator as shown in FIG. 3 being applied to the gate electrode of the MOS transistor $Q_{E53}$. The beta of the MOS transistors $Q_{D51}$, $Q_{E51}$ to $Q_{E53}$ are represented by $\beta_{D51}$, $\beta_{E51}$ to $\beta_{E53}$, respectively. When $V_O=V_L$, the MOS transistor $Q_{E53}$ is turned off and thus the MOS transistors $Q_{E52}$ and $Q_{E53}$ become irrelevant to the input circuit. At this time, the equivalent circuit is as shown in FIG. 39B and the loading capability corresponds to $\beta_{D1}$ of the MOS transistor $Q_{D51}$ per se and the drivability corresponds to $\beta_{E1}$ of the MOS transistor $Q_{E51}$. With $V_O=V_H$ the MOS transistor $Q_{E53}$ is always rendered in the ON state. At this time, the MOS transistor $Q_{E52}$ (Vin=$V_H$) is turned on and two current paths from Vout to $V_{SS}$ are established: one through the MOS transistor $Q_{D51}$ and the other through the series-connected drain-source current path of MOS transistors $Q_{E52}$ and $Q_{E53}$. With $V_O=V_H$ the equivalent circuit becomes an inverter as shown in FIG. 39C which comprises an enhancement type MOS transistor $Q_{Ea}$ having a composed beta of $$\beta_{E1} + \dfrac{\beta_{E2} \cdot \beta_{E3}}{\beta_{E2} + \beta_{E3}}$$

and a depletion MOS transistor having a beta of $\beta_{D1}$. In this case, it is assumed that the source-substrate bias effect, so-called "the back gate effect" on the threshold of the transistor $Q_{E52}$ is disregarded. When $V_O=V_H$, the beta of the MOS transistor at the enhancement mode side of the E/D type inverter is effectively $$1 + \dfrac{\beta_{E2} \cdot \beta_{E3}}{\beta_{E1}(\beta_{E2} + \beta_{E3})}$$

times larger than that in case of $V_O=V_L$. In other words, the fall time delay of Vout will be shortened to be approximately $$\left\{1 + \frac{\beta_{E2} \cdot \beta_{E3}}{\beta_{E1}(\beta_{E2} + \beta_{E3})}\right\}^{-1}$$

times the fall time delay when $V_O = V_H$. FIG. 39D shows an input/output signal transfer characteristic curve when $V_O = V_H$ and $V_O = V_L$ in this embodiment. $V_{TE}$ in FIG. 39D shows the threshold voltage of the enhancement mode MOS transistor.

Figure 40A:
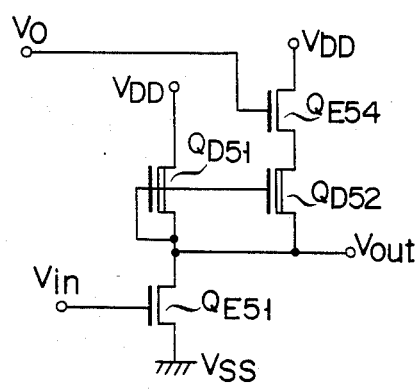
Figure 40B:
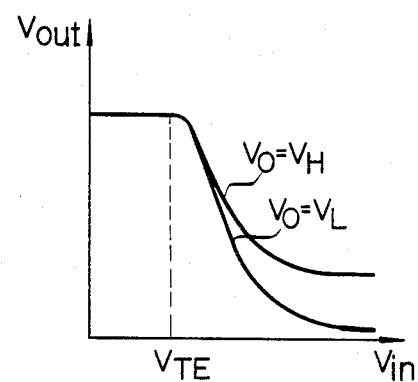

FIG. 40A shows a MOS logic circuit according to another embodiment of this invention in which an ordinary Enhancement/Depletion type inverter is utilized, FIG. 40B showing a transfer characteristic curve of this circuit. This MOS logic circuit includes the ordinary E/D type inverter constituted by MOS transistors $Q_{D51}$ and $Q_{E51}$, and further a depletion type MOS transistors $Q_{D52}$ and an enhancement type MOS transistor $Q_{E54}$, both source-drain current paths of which being series-connected between one terminal $V_{DD}$ and the node for the output terminal Vout, the gate electrode of which transistor $Q_{D52}$ being connected to that of the transistor $Q_{D51}$ so as to receive the input signal Vin, and the gate electrode of transistor $Q_{E54}$ being connected to receive the irreversible control voltage $V_O$ derived from the generator 300.

In this circuit, the fall transfer characteristic of Vout is substantially determined only by the MOS transistor $Q_{E51}$. As to the rise transfer characteristics of Vout, when $V_O = V_H$, however, not only the MOS transistor $Q_{E54}$ but also the MOS transistors $Q_{E54}$ and $Q_{D52}$ are associated with an increase in load drivability and the rise time delay will be shortened to a given extent. Because the MOS logic circuit includes a series arrangement of the MOS transistors $Q_{E54}$ and $Q_{D52}$, it is not easily possible to calculate the load drivability. Under the following conditions, however, a composed effective beta $\beta_D$ at $V_O = V_H$ can be given by (the beta of the MOS transistors $Q_{E54}$ and $Q_{D52}$ is $\beta_{E4}$ and $\beta_{D2}$ respectively):

(1) For $\beta_{E4} >> \beta_{D2}$ as well as Vout $< V_{DD} - V_{TE4}$ (where $V_{Te4}$ denotes a threshold voltage of the MOS transistor $Q_{E54}$)

$$\beta_D \approx \beta_{D1} + \beta_{D2}$$

(2) For $\beta_{E4} >> \beta_{D2}$ as well as Vout $\geq V_{DD} - V_{TE4}$ $$\beta_D \approx \beta_{D1}$$

(3) For $\beta_{E4} >> \beta_{D2}$ as well as Vout $< V_{DD} - V_{TE4}$ $$\beta_D \approx \beta_{D1} + \frac{K \cdot \beta_{E4} \cdot \beta_{D2}}{K \cdot \beta_{E4} + \beta_{D2}}$$

where $$K = \frac{\left(1 - \frac{V_{TE4}}{V_{DD} - V_{out}}\right)^2}{\frac{1}{2} + \frac{V_{TD2}}{V_{DD} - V_{out}}}$$

and that $-V_{TD2}$ stands for the threshold value of the MOS transistor $Q_{D52}$.

(4) For $\beta_{E4} << \beta_{D2}$ as well as Vout $\geq V_{DD} - V_{TE4}$ $$\beta_D \approx \beta_{D1}$$

FIG. 40B shows the input/output signal transfer characteristic curve of this embodiment at $V_O = V_H$ and $V_O = V_L$.

Figure 41A:
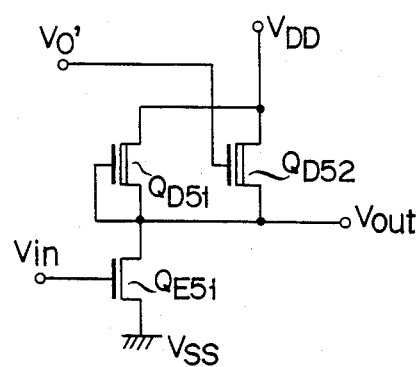
Figure 41B:
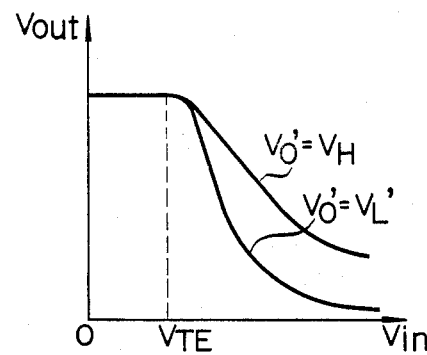

FIG. 41A shows a MOS logic circuit according to another embodiment of this invention, in which an E/D type inverter is utilized. Where it is possible to obtain a larger negative going voltage $V_L'$ as the irreversible voltage $V_O(V_O')$ than the threshold voltage $(-V_{TD})$ of the depletion type MOS transistor and since $V_L$ is closer to $V_{SS}$ than $V_L'$ enhancement type MOS transistor $Q_{E54}$ in FIG. 40A may be omitted as shown in FIG. 41A and the voltage $V_O'$ (which may have one or two voltages of either $V_L'$ or $V_H$) may be applied to the gate electrode of a MOS transistor $Q_{D52}$. At this time, the input/output signal transfer characteristic curve will be as shown in FIG. 41B.

Figure 42A:
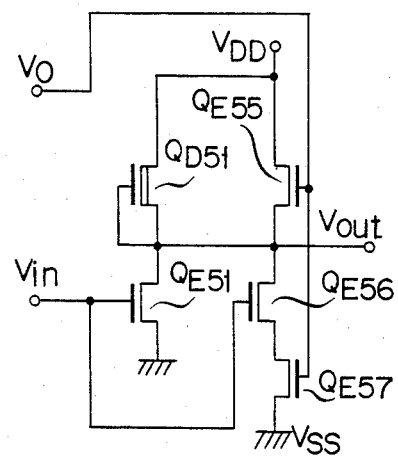
Figure 42B:
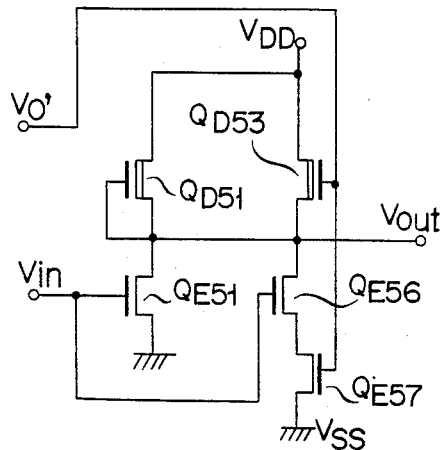

FIGS. 42A and 42B each show a MOS logic circuit according to another embodiment of this invention, in which an ordinary E/D type inverter is used and the beta of both the load transistor side and driver transistor side are adapted to be varied. The MOS logic circuit of FIG. 42A includes the ordinary E/d type inverter comprising MOS transistors $Q_{D51}$ and $E_{D51}$, in which at the load transistor $Q_{D51}$ side of the inverter an enhancement type MOS transistor $Q_{E55}$ is connected between one terminal $V_{DD}$ and the node for output Vout and has its gate electrode connected to receive the irreversible voltage $V_O$ as a gate input signal and at the driver transistor $Q_{E51}$ side thereof two enhancement type MOS transistors $Q_{E56}$ and $Q_{E57}$ are connected in series between an output Vout and the other terminal $V_{SS}$. The MOS transistor $Q_{E56}$ is connected to receive an input signal Vin as a gate input signal and the MOS transistor $Q_{E57}$ is connected to receive the voltage $V_O$ as a gate input signal. In the MOS logic circuit as shown in FIG. 42B a depletion type MOS transistor $Q_{D53}$ is used instead of the above-mentioned enhancement type MOS transistor $Q_{E55}$ and the above-mentioned $V_O'$ is used instead of $V_O$.

FIGS. 43A through 43E each show a MOS logic circuit according to another embodiment of this invention, in which an ordinary E/D type inverter is used. In this case, there are two kinds of voltage selections for the irreversible control voltage $V_O$; one is to use independently $V_{O1}$ and $V_{O2}$, the other is to use a $V_L'$ as $V_{O1}'$ and $V_{O2}'$ which goes more negative than the threshold voltage $-V_{TD}$ of the depletion type MOS transistor. By using these irreversible voltages it is possible for the beta to have two kinds of redundancy.

Figure 43A:
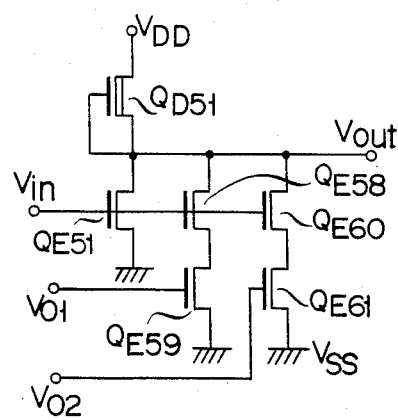

The MOS logic circuit of FIG. 43A includes the ordinary E/D type inverter comprising MOS transistors $Q_{D51}$ and $Q_{E51}$. In the driver transistor $Q_{E51}$ side of the inverter, two enhancement type MOS transistors $Q_{E58}$ and $Q_{E59}$ are connected in series between the node for the output Vout and one terminal $V_{SS}$ and connected to receive Vin and $V_{O1}$ as gate input signals, respectively, and two enhancement type MOS transistors $Q_{E60}$ and $Q_{E61}$ are connected in series between the node, the output Vout and one terminal $V_{SS}$ and in parallel with the series arrangement of the MOS transistors $Q_{E58}$ and $Q_{E59}$ and connected to receive Vin and $V_{O2}$ as gate input signals, respectively, whereby two kinds of redundancies are given to the beta of the driver transistor $Q_{E51}$ side.

Figure 43B:
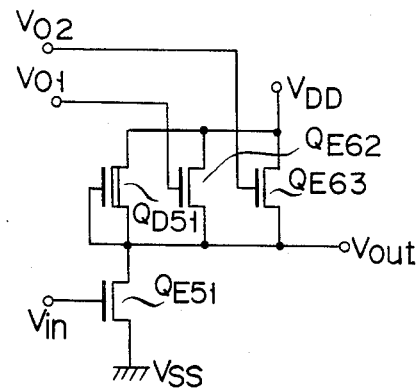

The MOS logic circuit of FIG. 43B includes the ordinary E/D inverter comprising MOS transistors $Q_{D51}$ and $Q_{E51}$ side. In the load transistor $Q_{D51}$ of the inverter, enhancement type MOS transistors $Q_{E62}$ and $Q_{E63}$ are connected in parallel between one terminal $V_{DD}$ and the node for the output Vout and connected to receive $V_{O1}$ and $V_{O2}$ as gate input signals, respectively, whereby two kinds of redundancies are given to the beta of the load transistor $Q_{D51}$ side.

Figure 43C:
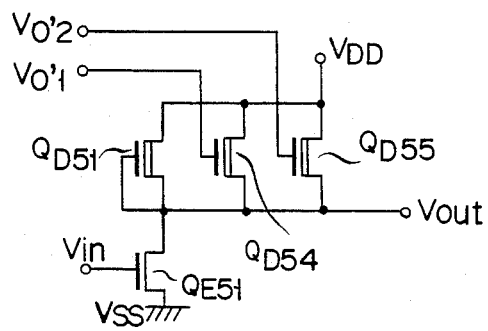

In the MOS logic circuit as shown in FIG. 43C, the enhancement type MOS transistors $Q_{E62}$ and $Q_{E63}$ in the MOS logic circuit of FIG. 43B have been replaced by depletion type MOS transistors $Q_{D54}$ and $Q_{D55}$, and the irreversible voltages $V_{O1}'$ and $V_{O2}'$ are applied to the gate electrodes of the MOS transistors $Q_{D54}$ and $Q_{D55}$, instead of $V_{O1}$ and $V_{O2}$.

Figure 43D:
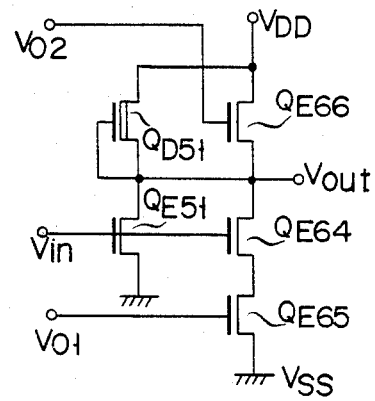

The MOS logic circuit of FIG. 43D includes the ordinary E/D inverter comprising MOS transistors $Q_{D51}$ and $Q_{E51}$. In the driver transistor $Q_{E51}$ side of the inverter, two enhancement type MOS transistors $Q_{E64}$ and $Q_{E65}$ are connected in series between the node for the output Vout and a terminal $V_{SS}$ and connected to receive Vin and $V_{O1}$ as gate input signals, respectively, and in the load transistor $Q_{D51}$ side an enhancement type MOS transistor $Q_{E66}$ is connected between one terminal $V_{DD}$ and the node for the output Vout and connected to receive $V_{O2}$ as a gate input signal, whereby one kind of redundancy is provided to each the beta of the load transistor $Q_{D51}$ side and the driver transistor $Q_{E51}$ side.

Figure 43E:
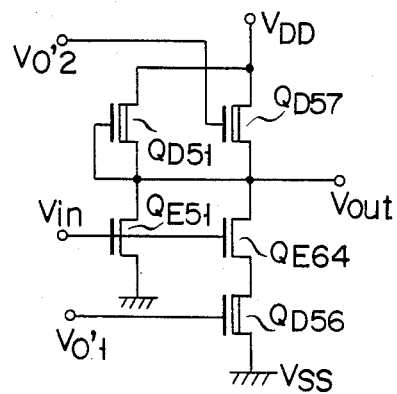

In the MOS logic circuit as shown in FIG. 43E, the above-mentioned enhancement type MOS transistors $Q_{E65}$ and $Q_{E66}$ in the MOS logic circuit of FIG. 43D have been replaced by two depletion type MOS transistors $Q_{D56}$ and $Q_{D57}$ and the irreversible control voltages $V_{O1}'$ and $V_{O2}'$ are applied to the gate electrodes of the MOS transistors $Q_{D56}$ and $Q_{D57}$, respectively.

Figure 44A:
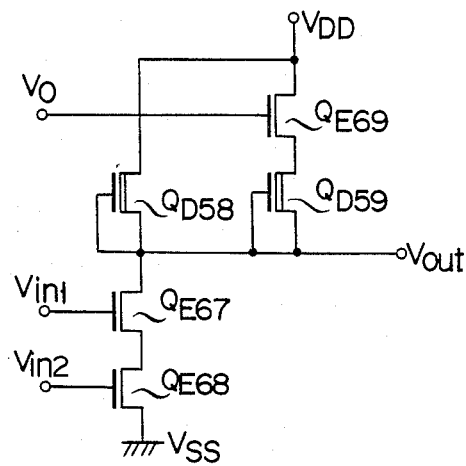
FIGS. 44A and 44B each show a circuit diagram of another embodiment belonging to the second category, in which a two-input type enhancement/depletion type NAND gate is used.
Figure 44B:
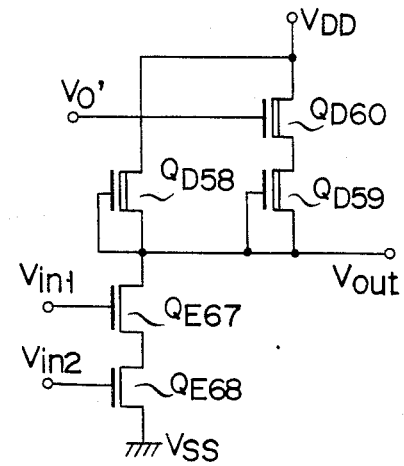

FIGS. 44A and 44B each show a MOS logic circuit according to another embodiment of this invention, in which an ordinary E/D type two-input NAND gate is used.

The MOS logic circuit of FIG. 44A includes the ordinary E/D type two-input NAND gate comprising a depletion type MOS transistor $Q_{D58}$ functioning as a load transistor having its source-drain current path connected between one terminal $V_{DD}$ and the node for the output Vout and and two enhancement type MOS transistors $Q_{E67}$ and $Q_{E68}$ functioning as driver transistors having their source-drain current paths connected in series between the output Vout and the other terminal $V_{SS}$ and having their gates connected to receive Vin1 and Vin2 as gate input signals, respectively, and further an enhancement type MOS transistor $Q_{E69}$ and a depletion type MOS transistor $Q_{D59}$ having their source-drain current paths connected in series between the one terminal $V_{DD}$ and the output Vout, and the irreversible voltages $V_O$ and Vout being applied to the gate electrodes of the MOS transistors $Q_{E69}$ and $Q_{D59}$, respectively.

In the MOS logic circuit as shown in FIG. 44B, the enhancement type MOS transistor $Q_{E69}$ of FIG. 44A has been replaced by the depletion type MOS transistor $Q_{D69}$ and $V_O'$ is applied to the gate of the MOS transistor $Q_{D60}$ instead of $V_O$.

In the MOS logic circuit the MOS transistor $Q_{E69}$ (FIG. 44A) or $Q_{D60}$ (FIG. 44B) is turned on or off by varying $V_O$ or $V_O'$. By so doing, it is possible to select a relatively greater or smaller load capability.

Figure 45:
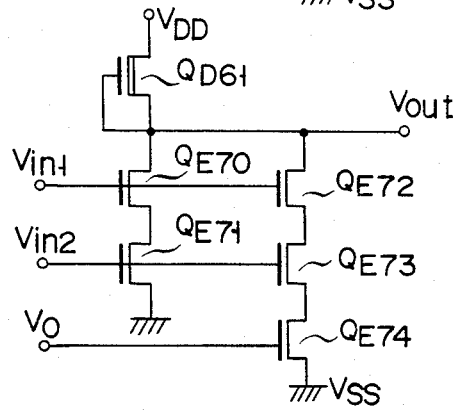
FIG. 45 shows a circuit diagram of another embodiment belonging to the second category, in which a two-input enhancement/depletion type NAND gate is used.

FIG. 45 shows a MOS logic circuit according to another embodiment of this invention, in which an ordinary E/D type two-input NAND gate is used. This MOS logic circuit includes the ordinary E/D type two-input NAND gate comprising a depletion type MOS transistor $Q_{D61}$ connected between $V_{DD}$ and Vout and acting as a load transistor and an enhancement type MOS transistors $Q_{E70}$ and $Q_{E71}$ connected in series between Vout and $V_{SS}$ and acting as driver transistors, and further three enhancement type MOS transistors $Q_{E72}$, $Q_{E73}$ and $Q_{E74}$ having their drain-source current paths connected in series between the node for the output Vout and one terminal $V_{SS}$ and connected to receive Vin1, Vin2 and $V_O$ as gate input signals, respectively. By setting $V_O = V_H$ or $V_O = V_L$, the MOS transistor $Q_{E74}$ is turned on or off, whereby it is possible to select a relatively greater or smaller drivability.

FIGS. 46A through 48B each show a MOS logic circuit according to another embodiment of this invention, in which an ordinary E/D type two-input NOR gate is used. The MOS logic circuit 46A includes the ordinary E/D type two-input NOR gate comprising a depletion type MOS transistor $Q_{D62}$ connected between one terminal $V_{DD}$ and the node for the output Vout and functioning as a load transistor and enhancement type MOS transistors $Q_{E75}$ and $Q_{E76}$ connected in parallel between an output Vout and the other terminal $V_{SS}$ and functioning as driver transistors, and further an enhancement type MOS transistor $Q_{E77}$ and a depletion type MOS transistor $Q_{D63}$ having their first source-drain current paths connected in series between the terminal $V_{DD}$ and the output Vout and the irreversible control voltages $V_O$ and Vout being applied to the gate electrodes of the MOS transistors $Q_{D77}$ and $Q_{D63}$, respectively.

Figure 46A:
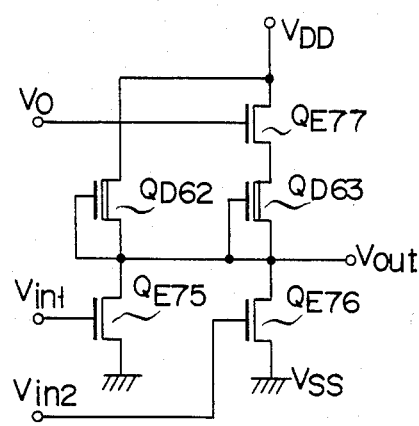
FIGS. 46 through 48 each show a circuit diagram of another embodiment belonging to the second category, in which a two-input type enhancement/depletion type NOR gate is employed.
Figure 46B:
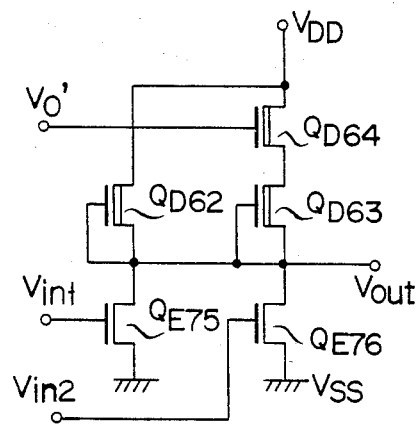

In the MOS logic circuit as shown in FIG. 46B, a depletion type MOS transistor $Q_{D64}$ is inserted in place of the above-mentioned enhancement type MOS transistor $Q_{E77}$ in FIG. 46A and the irreversible voltage $V_O'$ is applied to the gate electrode of the MOS transistor $Q_{D64}$ instead of $V_O$.

In the MOS logic circuits as shown in FIGS. 46A and 46B the MOS transistors $Q_{E77}$ or $Q_{D64}$ are turned on or off, respectively, by varying $V_O$ or $V_O'$, whereby a relatively greater or smaller load capability can be selected.

Figure 47:
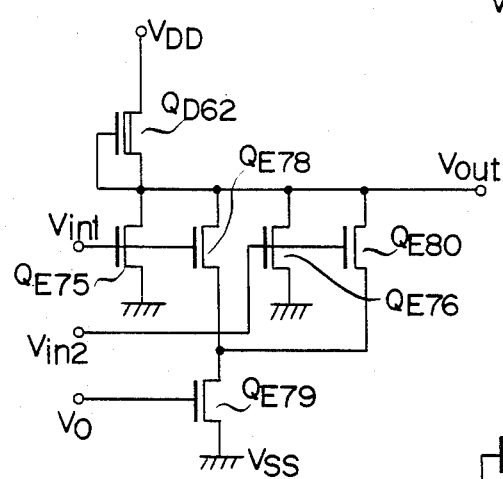

FIG. 47 shows a MOS logic circuit according to another embodiment of this invention. This MOS logic circuit includes an ordinary E/D type two-input NOR gate comprising a depletion type MOS transistor $Q_{D62}$ connected between one terminal $V_{DD}$ and the node for the output Vout and enhancement type MOS circuits $Q_{E75}$ and $Q_{E76}$ connected in parallel between the output Vout and the other terminal $V_{SS}$, and further two enhancement type MOS transistors $Q_{E78}$ and $Q_{E79}$ having their source-drain current paths connected in series between the output Vout and the terminal $V_{SS}$ and an enhancement type MOS transistor $Q_{E80}$ having its drain-source current path connected between the output Vout and the source of the MOS transistor $Q_{E79}$ and Vin1, Vin2 and $V_O$ being applied to the gate electrodes of the MOS transistors $Q_{E78}$, $Q_{E80}$ and $Q_{E79}$, respectively. In this MOS logic circuit, the MOS transistor $Q_{E79}$ is turned on or off by varying $V_O$, whereby a relatively greater or smaller drivability can be selected.

Figure 48A:
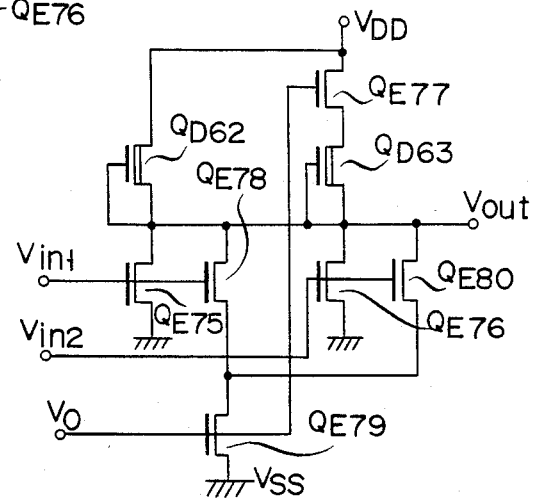

In the MOS logic circuit as shown in FIG. 48A, both the MOS transistors $Q_{E77}$ and $Q_{D63}$ as shown in FIG. 46A and the MOS transistors $Q_{E78}$, $Q_{E79}$ and $Q_{E80}$ in FIG. 47 are all inserted, whereby a relatively greater or smaller load capability and drivability can be selected.

Figure 48B:
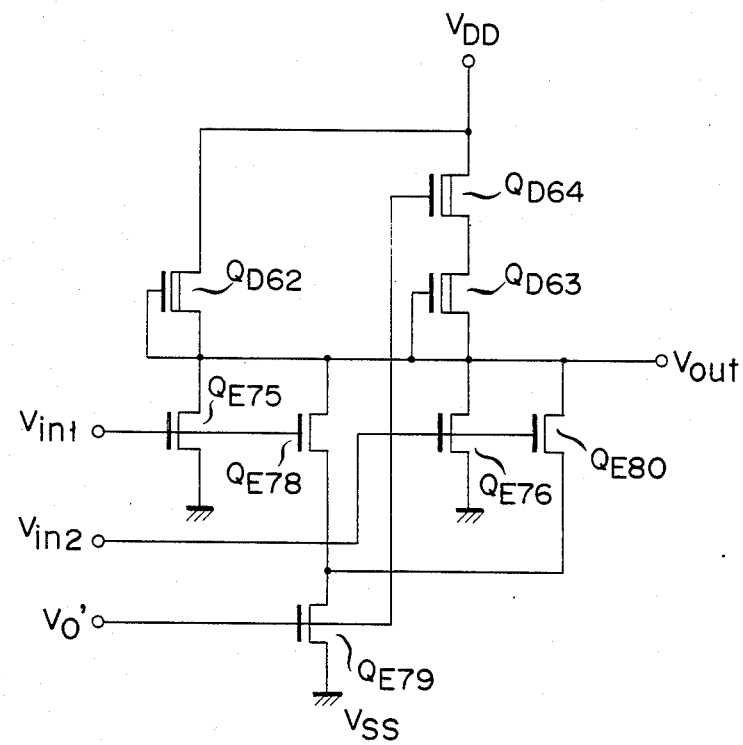

Finally, the MOS logic circuit as shown in FIG. 48B is the modified one as shown in FIG. 46B. Namely, instead of the above-mentioned enhancement transistor $Q_{E77}$ in FIG. 48A, a depletion MOS transistor $Q_{D64}$ is provided in the same circuit position. As a result, a relatively greater or smaller load capability and drivability can be realized.

In the above-mentioned respective MOS logic circuits, the input/output signal transfer characteristics, such as the drivability of the transistor can be changed by varying the irreversible voltages $V_O$ or $V_O'$, or $V_{O1}$, $V_{O2}$, $V_{O1}'$ or $V_{O2}'$, with the logic functions thereof unchanged. Consequently, if in the first instance, a MOS logic circuit is constructed without having any excess redundancy in electrical characteristics and in this case this circuit is properly operated, then it follows that a proper MOS logic circuit without any excess redundancy can be realized. To the contrary, if no adequate operation can be obtained from this circuit, the above-mentioned fuse element 2 or 12 is caused to burn out so as to vary the irreversible voltage $V_O$ which is applied to the MOS transistor as the control circuit 200, whereby the signal transfer characteristic of the circuit is changed to another one which has been initially designed. By so doing, the whole MOS logic circuit can be properly operated.

In other words, two or more design choices are prepared for a given MOS logic circuit and, by selecting one of them in irreversible fashion in connection with any proper circuit operation, it is possible to implement a MOS logic circuit having a proper circuit arrangement free from any excess redundancy.

This invention is not restricted to the above-mentioned embodiments and a variety of changes or modifications can be effected without departing from the scope and spirit of the invention. Although hereinbefore the NOR and NAND gates having two input signals have been explained, they may have three or more input signals.

Further, in the aforementioned embodiments, the drain-source current path of said control circuit transistor, e.g. third transistor Qn2 in FIG. 5 is connected between said node for the output terminal Vout and one of the supply terminals, e.g. $V_{SS}$ through the source-drain current path of one of the transistors employed in a logic circuit, e.g. the second transistor Qn1. It is, of course possible to reverse this series connection of the drain-source current paths for the second and third transistors. Also, in FIG. 20 where the drain-source current path of the second transistor $Q_{E3}$ to which gate electrode the first input signal is supplied, is connected between the node for Vout and $V_{SS}$ through the parallel-connected drain-source current paths of the third and fourth transistors $Q_{E5}$ and $Q_{E4}$ the irreversible control voltage maybe applied to the gate electrode of the third transistor $Q_{E4}$ and the second input signal maybe applied to the gate electrode of the fourth transistor $Q_{E5}$.

As stated above, according to the invention, by varying the irreversible control voltage derived from the generator having, e.g. the fuse element, a MOS logic circuit can have, on one hand, the capacity to change the logic functions thereof, whereby there is one advantage in avoiding a design modification which would require a change of the logic functions as well as an extra design allowance with regard to the signal transmission speed, and also have, on the other hand, redundancy of a change of the transfer characteristics between the input/output signals with the logic functions thereof remaining unchanged, whereby there is another advantage to avoid requiring a design involving excess voltage allowance as well as excess operation allowance.

Accordingly, the design for the MOS logic circuits according to the invention can be simplified, and it is possible to realize the MOS logic circuits cheaper in price without unnecessary allowances.

What is claimed is:

1. A MOS logic circuit comprising:

MOS logic circuit means coupled between a pair of power supply terminals ($V_{DD}$, $V_{SS}$), which circuit means performs a particular logic function and includes:

at least first and second MOS field effect transistors, at least one gate electrode of which is connected to a first signal input terminal, said first and second transistors having source-drain current paths mutually connected together to form a node;

a signal output terminal;

means for coupling said node to said signal output terminal (Vout);

signal generator means which includes a fuse for generating an irreversible control voltage (Vo); and control circuit means which includes at least a third MOS field effect transistor, a gate electrode of which is connected to receive said irreversible control voltage (Vo) derived from said generator means and a source-drain current path of which is coupled between one of said power supply terminals ($V_{DD}$, $V_{SS}$) and said node, whereby signal transfer characteristics between input/output signals of said MOS logic circuit means are changed under the control of said control circuit means with the logic function thereof remaining unchanged.

2. A MOS logic circuit as claimed in claim 1, characterized in that said MOS logic circuit means further comprises a fourth MOS field effect transistor, a gate electrode of which is connected to said first signal input terminal and a source-drain current path of which is connected to that of said third MOS field effect transistor of said control circuit means to form a series circuit arrangement, said series circuit arrangement being coupled between one of said power supply terminals ($V_{DD}$, $V_{SS}$) and said node.

3. A MOS logic circuit as claimed in claim 2, in which:

said MOS logic circuit means further comprises p-channel and n-channel field effect transistors as the first and second MOS transistors connected in the form of a C-MOS inverter, the gate electrodes of which are mutually connected together to said first signal input terminal, the drains of which are mutually connected together to form said node; and a p-channel field effect transistor as said fourth MOS transistor, the gate electrode of which is connected to said first signal input terminal; and wherein said control circuit means further comprises a p-channel field effect transistor as said third MOS transistor, the gate electrode of which is connected to said generator means, and the source-drain current path of which is series-connected between one of the power supply terminals ($V_{DD}$, $V_{SS}$) and said node through the source-drain current path of said fourth transistor.

4. A MOS logic circuit as claimed in claim 2, in which:
said MOS logic circuit means further comprises p-channel and n-channel field effect transistors as said first and second MOS transistors connected in the form of a C-MOS inverter, the gate electrodes of which are mutually connected together to said first signal input terminal, the drains of which are mutually connected together to form said node; and an n-channel field effect transistor as said fourth MOS transistor, the gate electrode of which is connected to said first signal input terminal; and wherein
said control circuit means further comprises an n-channel field effect transistor as said third MOS transistor, the gate electrode of which is connected to said generator means, and the source-drain current path of which is series-connected between one of the power supply terminals ($V_{DD}$, $V_{SS}$) and said node through the source-drain current path of said fourth transistor.

5. A MOS logic circuit as claimed in claim 2, in which:
said MOS logic circuit means further comprises p-channel and n-channel field effect transistors as said first and second MOS transistors, respectively, connected in the form of a first C-MOS inverter, the gate electrodes of which are mutually connected together to said first signal input terminal; and additional p-channel and n-channel field effect transistors as said fourth MOS transistor and as a fifth MOS transistor connected in the form of a second C-MOS inverter, with the gate electrodes of said fourth and fifth transistors mutually connected together to said first signal input terminal, and with the drains of said first, second, fourth and fifth transistors mutually connected together to form said node; and wherein
said control circuit means further comprises a p-channel field effect transistor as said third MOS transistor, the gate electrode of which is connected to said generator means, the source-drain current path of which is series-connected between one of the power supply terminals ($V_{DD}$, $V_{SS}$) and said node through the source-drain current path of said fourth p-channel transistor; and an additional inverter and an n-channel field effect transistor as a sixth MOS transistor, the gate electrode of which is connected via said additional inverter to said signal generator, the source-drain current path of which is series-connected between the other of the power supply terminals ($V_{DD}$, $V_{SS}$) and said node through the source-drain current path of said fifth n-channel transistor.

6. A MOS logic circuit as claimed in claim 2, in which:
said MOS logic circuit means further comprises p-channel and n-channel field effect transistors as said first and second MOS transistors connected in the form of a first C-MOS inverter, the gate electrodes of which are mutually connected together to said first signal input terminal; and two additional p-channel field effect transistors as said fourth MOS transistor and as a fifth MOS transistor, the gate electrodes of which are connected to said first signal input terminal, and the drains of which are connected to said node; and wherein
said control circuit means further comprises a p-channel field effect transistor as the third MOS transistor, the gate electrode of which is connected to the first signal generator means, the source-drain current path of which is series-connected between one of the power supply terminals ($V_{DD}$, $V_{SS}$) and said node through the source-drain current path of said fourth transistor; and another p-channel field effect transistor as a sixth MOS transistor, the gate electrode of which is connected to a second signal generator means ($V_{O2}$), the source-drain current path of which is series-connected between one of the power supply terminals ($V_{DD}$, $V_{SS}$) and said first node through the source-drain current path of said fifth transistor.

7. A MOS logic circuit as claimed in claim 2, in which said MOS logic circuit means forms a C-MOS NAND gate, and further comprises:
p-channel and n-channel field effect transistors as said first and second MOS transistors, the gate electrodes of which are mutually connected together to said first signal input terminal;
a p-channel field effect transistor as said fourth MOS transistor, the gate electrode of which is connected to said first signal input terminal, the drain of which being connected to said node;
an n-channel field effect transistor as a fifth MOS transistor, the gate electrode of which is connected to a second signal input terminal, the source-drain current path of which is series-connected between said node, through the source-drain current path of said second transistor, and one of the power supply terminals ($V_{DD}$, $V_{SS}$);
a p-channel field effect transistor as a sixth MOS transistor, the gate electrode of which is connected to said second signal input terminal, the source-drain current path of which is connected in parallel to that of said fourth transistor;
a p-channel field effect transistor as a seventh MOS transistor, the gate electrode of which is connected to said second signal input terminal ($V_{in2}$), the source-drain current path of which is connected in parallel with that of said first p-channel transistor; and wherein
said control circuit means further comprises a p-channel field effect transistor as said third MOS transistor, the gate electrode of which is connected to said generator means, the source-drain current path of which is series-connected between said other of said power supply terminals ($V_{DD}$, $V_{SS}$) to which said fifth transistor is not connected and said node through the parallel source-drain current paths of said fourth and sixth transistors.

8. A MOS logic circuit as claimed in claim 2, in which said MOS logic circuit means forms a C-MOS NAND gate, and further comprises:
p-channel and n-channel field effect transistors as said first and second MOS transistors, the gate electrodes of which are mutually connected together to said first signal input terminal, the drains of which are mutually connected together to form said node;
an n-channel field effect transistor as said fourth MOS transistor, the gate electrode of which is connected to said first signal input terminal, the drain of which is connected to said node;
an n-channel field effect transistor as a fifth MOS transistor, the gate electrode of which is connected to a second signal input terminal, the source-drain current path of which is series-connected between said node, through the source-drain current path of said second n-channel transistor, and one of the power supply terminals ($V_{DD}$, $V_{SS}$);

a p-channel field effect transistor as said sixth MOS transistor, the gate electrode of which is connected to said second signal input terminal, the source-drain current path of which is connected between the other of said power supply terminals ($V_{DD}$, $V_{SS}$) to which said fifth transistor is not connected and said node;

an n-channel field effect transistor as a seventh MOS transistor, the gate electrode of which is connected to said second signal input terminal, the source-drain current path of which is series-connected to said node through the source-drain current path of said fourth n-channel transistor to form a series circuit arrangement; and wherein said control circuit means further comprises an n-channel field effect transistor as said third MOS transistor, the gate electrode of which is connected to said generator means, the source-drain current path of which is series-connected between the one of said power supply terminals ($V_{DD}$, $V_{SS}$) to which said fifth transistor is connected and said node through said series circuit arrangement of said fourth and seventh n-channel transistors.

9. A MOS logic circuit as claimed in claim 2, in which said MOS logic circuit means forms a C-MOS NAND gate and further comprises:

p-channel and n-channel field effect transistors as said first and second MOS transistors, the gate electrodes of which are mutually connected to said first signal input terminal, the drains of which are mutually connected together to form said node;

a p-channel field effect transistor as said fourth MOS transistor, the gate electrode of which is connected to said first signal input terminal, the drain of which is connected to said node;

an n-channel field effect transistor as a fifth MOS transistor, the gate electrode of which is connected to said first signal input terminal, the drain of which is connected to said node;

an n-channel field effect transistor as a sixth MOS transistor, the gate electrode of which is connected to a second signal input terminal, the source-drain current path of which is series-connected between said node, through the source-drain current path of said second transistor, and one of the power supply terminals ($V_{DD}$, $V_{SS}$);

a p-channel field effect transistor as a seventh MOS transistor, the gate electrode of which is connected to said second signal input terminal, the source-drain current path of which is connected between the other of said power supply terminals ($V_{DD}$, $V_{SS}$) to which said sixth transistor is not connected and said node;

a p-channel field effect transistor as an eighth MOS transistor, the gate electrode of which is connected to said second signal input terminal, the source-drain current path of which is connected in parallel with the source-drain current path of said fourth p-channel transistor;

an n-channel field effect transistor as a ninth MOS transistor, the gate electrode of which is connected to said second signal input terminal, the drain of which is connected to said node through the source-drain current path of said fifth n-channel transistor to form a series circuit arrangement; and wherein said control circuit means further comprises a p-channel field effect transistor as said third MOS transistor, the gate electrode of which is connected to said generator means, the source-drain current path of which is series-connected between the other of said power supply terminals ($V_{DD}$, $V_{SS}$) to which said sixth transistor is not connected and said node through the parallel source-drain current paths of said fourth and eighth transistors, and an n-channel field effect transistor as a tenth MOS transistor, the gate electrode of which is connected to said generator means through an inverter, the source-drain current path of which is series-connected between one of said power supply terminals ($V_{SS}$) to which said sixth transistor is connected and said node through said series circuit arrangement of the source-drain current paths of said fifth and ninth n-channel transistors.

10. A MOS logic circuit as claimed in claim 2, in which said MOS logic circuit means forms a NOR gate, and further comprises:

p-channel and n-channel field effect transistors as said first and second MOS transistors, the gate electrodes of which are mutually connected to said first signal input terminal (Vin1), the drains of which are mutually connected together to form said node;

an n-channel field effect transistor as said fourth MOS transistor, the gate electrode of which is connected to said first signal input terminal, the drain of which is connected to said node;

a p-channel field effect transistor as a fifth MOS transistor, the gate electrode of which is connected to a second signal input terminal, the source-drain current path of which is series-connected between one of said power supply terminals ($V_{DD}$, $V_{SS}$) and said node through the source-drain current path of said first p-channel transistor;

an n-channel field effect transistor as a sixth MOS transistor, the gate electrode of which is connected to said second signal input terminal, the source-drain current path of which is connected between said node and the other of said power supply terminals ($V_{DD}$, $V_{SS}$) not connected to said fifth transistor;

an n-channel field effect transistor as a seventh MOS transistor, the gate electrode of which is connected to said second signal input terminal, the source-drain current path of which is connected in parallel with the source-drain current path of said fourth n-channel transistor; and wherein said control circuit means further comprises an n-channel field effect transistor as said third MOS transistor, the gate electrode of which is connected to said generator means, the source-drain current path of which is series-connected between the other of said power supply terminals ($V_{DD}$, $V_{SS}$), not connected to said fifth transistor and said node through the parallel circuit arrangement of said fourth and seventh transistors.

11. A MOS logic circuit as claimed in claim 2, in which said MOS logic circuit means forms a NOR gate, and further comprises:

p-channel and n-channel field effect transistor as said first and second MOS transistors, the gate electrodes of which are mutually connected to said first signal input terminal (Vin1), the drains of which are mutually connected together to form said node;

a p-channel field effect transistor as said fourth MOS transistor, the gate electrode of which is connected to said first signal input terminal, the drain of which is connected to said node;

a p-channel field effect transistor as a fifth MOS transistor, the gate electrode of which is connected to a second signal input terminal, the source-drain current path of which is series-connected between one of the power supply terminals ($V_{DD}$, $V_{SS}$) and said node through the source-drain current path of said first p-channel tansistor;

an n-channel field effect transistor as a sixth MOS transistor, the gate electrode of which is connected to said second signal input terminal, the source-drain current path of which is connected between said node and the other power supply terminals ($V_{DD}$, $V_{SS}$) to which said fifth transistor is not connected;

a p-channel field effect transistor as a seventh MOS transistor, the gate electrode of which is connected to said second signal input terminal, the source-drain current path of which being connected to said node through the source-drain current path of said fourth p-channel transistor; and wherein said control circuit means further comprises a p-channel field effect transistor as said third MOS transistor, the gate electrode of which is connected to said generator means, the source-drain current path of which is series-connected between one of the power supply terminals ($V_{DD}$, $V_{SS}$) and said node through the source-drain current path of said seventh and fourth transistors.

12. A MOS logic circuit as claimed in claim 11, in which:

said MOS logic circuit means further comprises an n-channel field effect transistor as an eighth MOS transistor, the gate electrode of which being connected to the first signal input terminal, the drain of which is connected to said node;

an n-channel field effect transistor as a ninth MOS transistor, the gate electrode of which is connected to said second signal input terminal, the source-drain current path of which is connected in parallel to that of said eighth MOS transistor; and wherein said control circuit means further comprises an n-channel field effect transistor as a tenth MOS transistor, the gate electrode of which is connected to said generator means, the source-drain current path of which is series-connected between the other of said power supply terminals ($V_{DD}$, $V_{SS}$) to which said fifth transistor is not connected and said node through the parallel circuit arrangement of said eighth and ninth transistors.

13. A MOS logic circuit as claimed in claim 1, characterized in that the source or drain of said third MOS field effect transistor is directly connected between one of said power supply terminals ($V_{DD}$, $V_{SS}$) and said node.

14. A MOS logic circuit as claimed in claim 13, further comprising inverter means which is interposed between the mutually-connected ends of said source-drain current paths of said first and second MOS field effect transistors, and said node.

15. A MOS logic circuit as claimed in claim 13, in which:

said MOS logic circuit means further comprises p-channel and n-channel field effect transistors as said first and second MOS transistors, respectively, connected in the form of a first inverter, with the gate electrode of said second transistor connected to said first signal input terminal, and the gate electrode of said first transistor connected to one of the power supply terminals ($V_{DD}$, $V_{SS}$), and with the drains of said first and second transistors mutually connected together to form said node; and an additional p-channel and an additional n-channel field effect transistor formed as said fourth MOS transistor and as a fifth MOS transistor, respectively, said fourth and fifth transistors connected in the form of a second inverter which forms said means for coupling said node to said signal output terminal (Vout), the gate electrodes of which are mutually connected together to said node, the drains of which are mutually connected to said signal output terminal (Vout), and the source-drain current paths of which are series-connected between said power supply terminals ($V_{DD}$, $V_{SS}$); and wherein said control circuit means further comprises a p-channel field effect transistor as said third MOS transistor, the gate electrode of which is connected to said generator means, and the source-drain current path of which is series-connected between one of said power supply terminals ($V_{DD}$, $V_{SS}$) and said node.

16. A MOS logic circuit as claimed in claim 15, in which said MOS logic circuit means further comprises two additional n-channel field effect transistors as sixth and seventh MOS transistors, the gate electrode of which are connected to second and third signal input terminals, respectively, and the source-drain current paths of which are series-connected between said node and one of the power supply terminals ($V_{DD}$, $V_{SS}$).

17. A MOS logic circuit as claimed in claim 13, in which:

said MOS logic circuit means further comprises p-channel and n-channel field effect transistors as said first and second MOS transistors, respectively, connected in the form of a first inverter, with gate electrode of said first transistor connected to said first signal input terminal, and the gate electrode of said second transistor connected to one of the power supply terminals ($V_{DD}$, $V_{SS}$), and with the drains of said first and second transistors mutually connected together to form said node; and an additional p-channel transistor and an additional n-channel transistor as fourth and fifth MOS transistors, respectively, said fourth and fifth transistors connected in the form of a second inverter which forms said means for coupling said node to said signal output terminal (Vout), the gate electrodes of which are mutually connected together to said node, the drains of which being mutually connected to said signal output terminal (Vout), and the source-drain current paths of which are series-connected between said power supply terminals ($V_{DD}$, $V_{SS}$); and wherein said control circuit means further comprises an n-channel field effect transistor as said third MOS transistor, the gate electrode of which is connected to said generator means, the source-drain current path of which is series-connected between one of the power supply terminals ($V_{DD}$, $V_{SS}$) and said node.

18. A MOS logic circuit as claimed in claim 17, in which said MOS logic circuit means further comprises two additional p-channel field effect transistors as sixth and seventh MOS transistors, each gate electrode of which being connected to second and third signal input terminals, respectively, and each source-drain current path of which is series-connected between said node and one of the power supply terminals ($V_{DD}$, $V_{SS}$).

19. A MOS logic circuit as claimed in claim 13, in which said MOS logic circuit means forms an Exclusive-OR gate, and comprises:

p-channel and n-channel field effect transistors as said first and second MOS transistors, respectively, with the gate electrode of said second transistor connected to said first signal input terminal, the gate electrode of said first transistor connected to one of said power supply terminals ($V_{DD}$, $V_{SS}$), and with the drains of said first and second transistors being mutually connected together to form said node;

a first inverter comprising said means for coupling said node to said signal output terminal (Vout);

second, third, fourth and fifth inverters;

an n-channel field effect transistor as the fourth MOS transistor, the gate electrode of which is connected to said first signal input terminal via said second inverter, the drain of which is connected to said node;

two n-channel field effect transistors as fifth and sixth MOS transistors, with the gate electrode of said fifth transistor connected to a second signal input terminal, the gate electrode of said sixth transistor connected via said third inverter to said second signal input terminal, and with the source-drain current paths of said fifth and sixth transistors connected to said node through the source-drain current paths of said second and fourth transistors, respectively; and two n-channel field effect transistors as seventh and eighth MOS transistors, with the gate electrode of said seventh transistor connected to a third signal input terminal, the gate electrode of said eighth transistor connected to said third signal input terminal via said fourth inverter, and with the source-drain current paths of said seventh and eighth transistors connected between the other said power supply terminals ($V_{DD}$, $V_{SS}$) to which said drain of said first transistor is not connected and said node through the source-drain current paths of said second and fifth transistors, and said sixth and fourth transistors, respectively; and wherein said control circuit means further comprises a p-channel field effect transistor as said third MOS transistor, the gate electrode of which is connected to said generator means via said fifth inverter, and the source-drain current path of which is series-connected between one of the power supply terminals ($V_{DD}$, $V_{SS}$) and said node.

* * * * *